United States Patent
Chua et al.

(10) Patent No.: US 7,764,721 B2
(45) Date of Patent: Jul. 27, 2010

(54) SYSTEM FOR ADJUSTING THE WAVELENGTH LIGHT OUTPUT OF A SEMICONDUCTOR DEVICE USING HYDROGENATION

(75) Inventors: Christopher L. Chua, San Jose, CA (US); Michael A. Kneissl, Berlin (DE); Noble M. Johnson, Menlo Park, CA (US); Peter Kiesel, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 11/300,962

(22) Filed: Dec. 15, 2005

(65) Prior Publication Data
US 2007/0153852 A1    Jul. 5, 2007

(51) Int. Cl.
*H01S 5/00*    (2006.01)
(52) U.S. Cl. .................................. 372/44.01
(58) Field of Classification Search ............... 372/44.01
See application file for complete search history.

(56) References Cited

U.S. PATENT DOCUMENTS

| | | | |
|---|---|---|---|
| 4,875,216 A | 10/1989 | Thornton et al. | |
| 5,173,914 A | 12/1992 | Kokubo | |
| 5,177,757 A | 1/1993 | Tsugami | |
| 5,238,868 A | 8/1993 | Elman et al. | |
| 5,319,655 A * | 6/1994 | Thornton | 372/23 |
| 5,491,711 A | 2/1996 | Mand et al. | |
| 5,518,935 A * | 5/1996 | Cunningham et al. | 438/45 |
| 5,843,802 A | 12/1998 | Beernink et al. | |
| 6,055,258 A | 4/2000 | Beyea et al. | |
| 6,133,058 A | 10/2000 | Kidoguchi et al. | |
| 6,136,626 A | 10/2000 | Kidoguchi et al. | |
| 6,789,957 B1 * | 9/2004 | Colgan et al. | 385/89 |
| 7,106,448 B1 | 9/2006 | Vawter et al. | |
| 2002/0076149 A1 | 6/2002 | Deacon | |
| 2003/0021318 A1 * | 1/2003 | Liao et al. | 372/46 |
| 2003/0021326 A1 * | 1/2003 | Liao et al. | 372/96 |
| 2003/0095736 A1 * | 5/2003 | Kish, Jr. et al. | 385/14 |
| 2003/0219917 A1 * | 11/2003 | Johnson et al. | 438/22 |
| 2004/0013155 A1 * | 1/2004 | Burak | 372/96 |
| 2004/0033637 A1 * | 2/2004 | Johnson | 438/22 |
| 2004/0219703 A1 | 11/2004 | Bour et al. | |

FOREIGN PATENT DOCUMENTS

EP    617491 A2 *    9/1994

OTHER PUBLICATIONS

Baldassarri et al., "Hydrogen-induced band gap tuning of (InGa)(AsN)/GaAs single quantum wells", May 28, 2001, American Institute of Physics, Applied Physics Letters, vol. 78, 3472-3474.*

(Continued)

*Primary Examiner*—Minsun Harvey
*Assistant Examiner*—Joshua King
(74) *Attorney, Agent, or Firm*—Jonathan A. Small

(57) ABSTRACT

A method and structure for adjusting the wavelength output of a semiconductor device is described. In the method, the hydrogen concentration in an active region of the semiconductor device is adjusted either during fabrication or after the device has been fabricated. The adjustment provides a simple technique for fine tuning many device types including regular lasers and VCSEL structures. The adjustment also allows for mass production of lasers of many different frequencies on a single wafer substrate, a system particularly desirable for wavelength division multiplexing systems.

21 Claims, 15 Drawing Sheets

OTHER PUBLICATIONS

Polimeni et al., "Effect of hydrogen on the electronic properties of InGaAsN/GaAs quantum wells", 2001, the American Physical Society, Physical Review B, vol. 63, 201304-1 thru 201304-4.*

Charbonneau, S., et al., Band-gap tuning of InGaAs/InGaAsP/InP Laser Using High Energy Ion Implantation, American Institute of Physics, Appl. Phys. Letter, vol. 67, Nov. 13, 1995, pp. 2954-2956.

Beernink, D., et al., Dual-wavelength AlGaAs/GaAs Laser by Selective Removal Of A Quantum Well In An Asymmetric Dual Quantum Well Structure, American Institute of Physics, Appl. Phys. Letter, vol. 68, Jan. 15, 1996, pp. 284-286.

Chevallier, et al: Neutralization of Defects and Dopants in III-V Semiconductors, Academic Press, 1991, Semiconductors and Semimetals, vol. 34, pp. 447-465.

Polimeni, et al: Effect of Hydrogen on the Electronic Properties of $In_xGa_{1-x}As_{1-y}N_y$/GaAs Quantum Wells, 2001 The American Physical Society, Physical Review B., vol. 63, 201304(R) pp. 1-4.

Baldassarri, G, et al: Hydrogen-Induced Band Gap Tuning of (InGA)(AsN)/GaAs Single Quantum Wells, Applied Physics Letters, May 28, 2001, vol. 78, No. 22, pp. 3472-3474.

Kitani, Takeshi, et al: Characterization of the Refractive Index of Strained GaInNAs Layers by Spectroscopic Ellipsometry, JPN J. Appl. Physics, I. 37, Part 1., No. 3A, pp. 753-757, 1998.

* cited by examiner

| | STRUCTURE | Γ | $N_{EFF}$ | $\Delta N_{EFF}$ |
|---|---|---|---|---|
| 604 | InGaAsN-SQW / GaAs spacer<br>n=3.68 / n=3.44 | 2.35% | 3.133 | 0.004 |
| 608 | InGaAsN:H-SQW / GaAs spacer<br>n=3.52 / n=3.44 | 2.30% | 3.129 | |
| 612 | InGaAsN-SQW / GaAsN spacer<br>n=3.68 / n=3.60 | 2.69% | 3.171 | 0.042 |
| 616 | InGaAsN:H-SQW / GaAsN:H spacer<br>n=3.52 / n=3.44 | 2.30% | 3.129 | |
| | 628 | 620 | 624 | 640 |

FIG. 18A
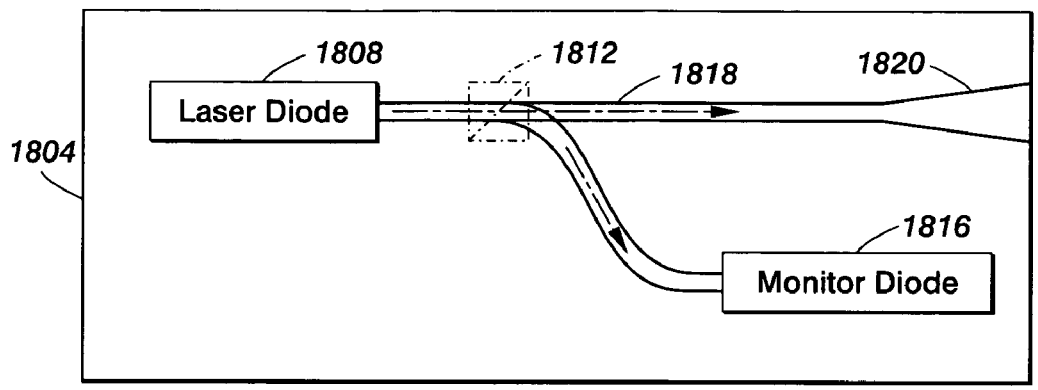
FIG. 18B
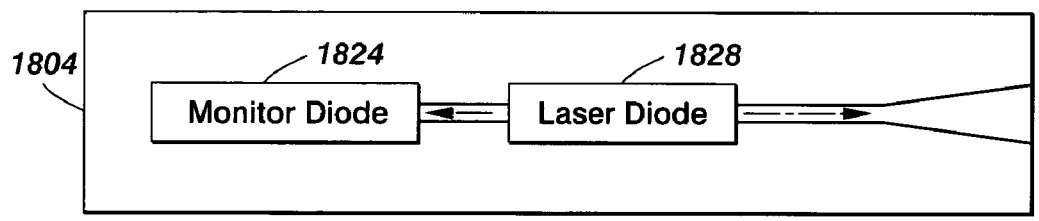
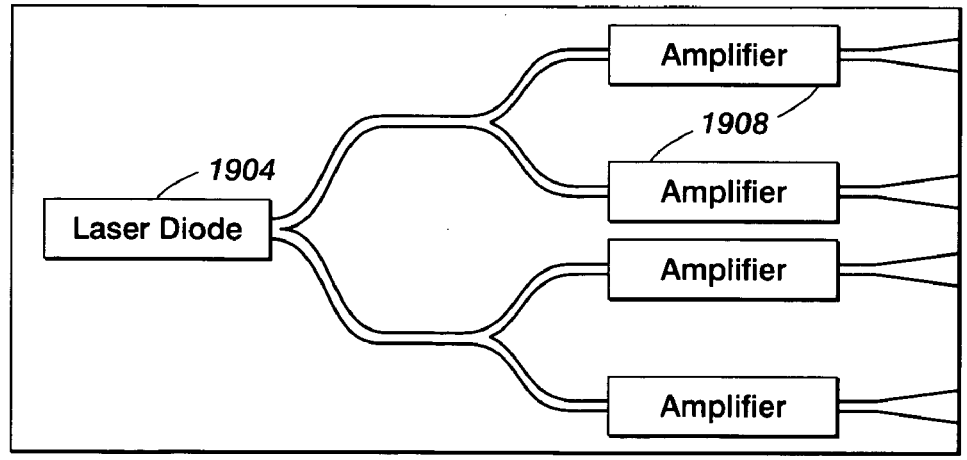
FIG. 19

SYSTEM FOR ADJUSTING THE WAVELENGTH LIGHT OUTPUT OF A SEMICONDUCTOR DEVICE USING HYDROGENATION

CROSS-REFERENCE TO RELATED APPLICATIONS

This Application is related to U.S. patent application Ser. No. 11/300,861 entitled "High Power Semiconductor Device with Low-Absorptive Facet Window", and U.S. patent application Ser. No. 11/304,221 entitled "Buried Lateral Index Guided Lasers and Lasers with Lateral Current Blocking Lasers", and U.S. patent application Ser. No. 11/300,871 entitled "On-Chip Integration of Passive and Active Optical Components Enabled by Hydrogenation", all assigned to the same assignee and filed on the same day on Dec. 15, 2005, and all are hereby incorporated by reference.

BACKGROUND

The growing role of wavelength division multiplexing (WDM) in optical communication systems has driven the need for semiconductor laser sources that can emit at different wavelengths. Current WDM systems for example use over 100 wavelengths spanning a range from about 1525 nm to about 1600 nm. With the advent of Raman amplifiers and new high bandwidth filters, WDM transmission wavelengths are expected to encompass the so called S-band nearing 1300 nm. Lasers based on InGaAsN can potentially cover the entire wavelength range from 1200 to 1600 nm.

Fabricating a number of semiconductor lasers spanning a wavelength range has proven to be a difficult challenge. One method is to adjust the composition of the active material by changing the growth recipe of each laser device. In particular, the active layer of each laser may differ according to the desired output frequency. The variation may be achieved by varying the epitaxial growth of each active layer as described in U.S. Pat. No. 6,167,074 entitled "Monolithic Independently Addressable Red/IR Side by Side Laser" by Sun et al. filed Feb. 24, 2000 and hereby incorporated by reference.

One problem with a multiple recipe approach is the difficulty of implementation in manufacturing settings. In particular, applying different recipes can result in delays and reproducibility problems associated with recipe changes. Multiple recipes also increase costs. For example, different reaction chambers may typically be used to accommodate different recipes. Some implementation would involve a regrowth. Etching and regrowth processes are undesirable because of the high cost associated with pre-regrowth sample preparation, the epitaxial regrowth process itself, and the manufacturing logistics involved. An additional drawback is the non-planar morphology that results.

Alternative approaches to produce laser arrays with varying emission wavelength are based on growth techniques such as migration-enhanced epitaxy and temperature-graded substrate condition. However these techniques are complicated, time consuming and are difficult to precisely control. Failure to maintain tight controls results in difficulty controlling the emission wavelength.

Thus a simpler and less expensive way of tuning the wavelength output of an InGaAsN laser is needed.

SUMMARY

A method for tuning a semiconductor device to output light is described. The method involves forming a semiconductor structure including an active region. The amount of hydrogen in the active region is changed to reach a desired wavelength. The technique may be used for VCSELs or for tuning to different frequencies lasers in an array of lasers. The tuning may be done during or after the laser is fabricated. In one embodiment, hydrogenation may be used to shape the lateral index changes. These lateral index changes may be used to control the polarization of the laser output.

BRIEF DESCRIPTION OF THE DRAWINGS

FIGS. 18-21 show various integrated optical circuits that may be fabricated on a single semiconductor wafer using the described waveguides.

DETAILED DESCRIPTION

Figure 1:
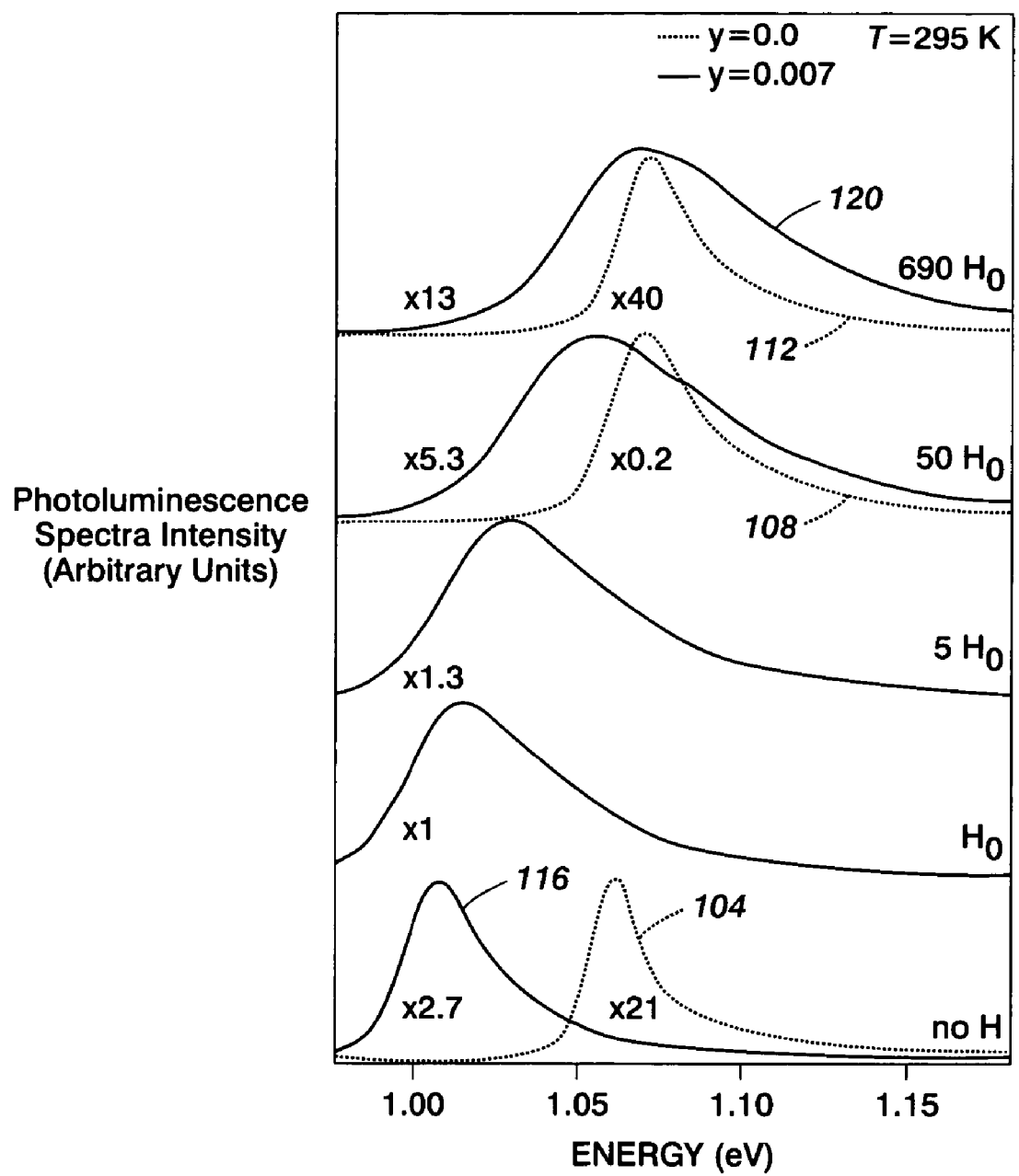
FIG. 1 shows a graph plotting the output photoluminescence spectra of InGaAsN/GaAs quantum wells doped with various quantities of hydrogen.

A system for forming and interconnecting optoelectronic devices is described. The system controls exposes a semiconductor compound including at least GaAsN to hydrogen in a hydrogen concentration adjustment process. More typically, the GaAsN is an alloy that includes at least one of either aluminum to form AlGaAsN or Indium to form InGaAsN. For convenience, the specification will refer to InGaAsN, although it should be understood that the invention should apply to any semiconductor material that changes bandgap as a result of exposure to hydrogen, and the most common semiconductor materials that exhibit this property are alloys, typically AlGaAsN or InGaAsN. By controlling the amount of hydrogen in the sample, the bandgap of the sample can be controlled thereby controlling the sample's refractive index as well as absorption properties.

As used herein, "altering" or "changing the hydrogen concentration" is broadly defined to include all methods of increasing or decreasing the concentration of hydrogen in a material. The adjustments may be accomplished by either removing previously incorporated hydrogen or by adding hydrogen atoms and/or molecules. Incorporation or otherwise adding hydrogen to a material may be accomplished using various techniques, including but not limited to, diffusion through exposure of a sample to a hydrogen gas. In one example, a layer is grown by Metal Organic Vapor Phase Epitaxy (MOCVD), where hydride precursor gases such as ammonia are typically employed. Moreover, hydrogen is usually the carrier gas of choice for flowing metal organics for building the epitaxial structure. The hydrogen-rich environment in the entire growth process makes it easy to incorporate hydrogen into the material during epitaxial growth. Masks may be used to control the regions that are exposed to hydrogen.

Alternately, changing hydrogen concentrations may refer to a hydrogen ion implantation wherein high energy hydrogen particles are directed at the sample to selectively incorporate hydrogen into a sample. Ion implantation, selective areas of the material can be masked off by photoresist during device fabrication. The unmasked surfaces can then be exposed to standard hydrogen ion implantation accelerated at, typically, between 50 KeV to 350 KeV depending on the penetration depth desired. In practice, the exact dosage and energy levels required is determined experimentally using Secondary Ion Mass Spectroscopy (SIMS) characterization in conjunction with electroluminescence measurements. Monte Carlo computer simulation techniques using software such as the popular SRIM and TRIM packages can also be employed to model the ion implantation process. Sources of hydrogen include, but are not limited to low energy Kaufman sources and plasma hydrogenation systems.

As defined and used herein, altering or changing hydrogen concentrations is not limited to increasing hydrogen concentrations. Hydrogen concentration changes also include processes of removing previously incorporated hydrogen atoms from a pre-hydrogenated sample. An example method of reducing hydrogen concentration is to anneal portions of a sample, typically at temperatures about 500 degrees centigrade or above during fabrication. Controlled removal from specific regions may be effected by patterning a region with a "hydrogen getter" such as palladium and then heating the sample. Electron beam irradiation or wavelength selected laser writing also provide methods of localized heating for selective area hydrogen removal.

Changing the hydrogen concentrations in InGaAsN materials produces a bandgap shift in InGaAsN materials or samples. The process is described in G. Baldassarri, M. Bissiri, A. Polimeni, and M. Capizzi, "Hydrogen-induced Bandgap Tuning of (InGa)(AsN)/GaAs Single Quantum Wells" Appl. Phys. Lett., Vol. 78(22), pp. 3472-3474, (2001) which is hereby incorporated by reference. The effects of hydrogen on the InGaAsN bandgap may be measured by observing the photon energy of the photoluminescence peak of InGaAsN/GaAs quantum well at different hydrogen concentrations.

FIG. 1 (taken from the above cited Baldassarri reference) plots the output photoluminescence spectrum of a plurality of $In_{0.34}Ga_{0.66}As_{1-y}N_y$/GaAs quantum well structures as a function of quantum well hydrogen concentrations. The dashed curves 104, 108, 112 show the photoluminescence of a reference sample with y=0 (thus no nitrogen) while the solid curves show the photoluminescence of a reference sample with y=0.007. $H_O$ in the figure represents a hydrogen concentration that results from exposures to a hydrogen flux of $1 \times 10^{16}$ hydrogen atoms/cm$^2$ In the absence of hydrogenation, the energy difference between the photons output by an InGaAsN active region and the photons output by an InGaAs (no nitrogen) active region is approximately 0.05 electron volts (eV). In particular, curve 116 peaks around 1.01 eV indicating the majority of photons output by InGaAs has an energy of 1.01 eV. Curve 104 peaks around 1.06 eV indicating the majority of photons output by InGaAsN have an energy of around 1.06 eV. Increasing hydrogenation levels (increased hydrogen concentrations) increases the output photon energies of nitrogen containing materials. In particular, at a concentration of 690 $H_O$ (a concentration resulting from a flux of $690 \times 10^{16}$ hydrogen atoms/cm$^2$) shown in curve 120, the bandgap of $In_{0.34}Ga_{0.66}As_{0.993}N_{0.007}$/GaAs shifts by about 60 meV resulting in a bandgap similar to that of a nitrogen free reference sample shown by curve 112.

Changing the bandgap of a material not only alters the light output by a material, it also has other effects. For example, changing the bandgap changes the refractive index of a material and also the photon absorption properties of the material. As the InGaAsN material bandgap increases due to increased hydrogen concentration, the refractive index decreases. A typical change in the index of refraction is an index shift from about 3.68 to an index of about 3.52 for light with a 1.3 micrometer wavelength. The associated refractive index shift is described in T. Kitatani, M. Kondow, K. Hinoda, Y. Yazawa and M. Okai, "Characterization of the Refractive Index of Strained GaInNAs Layers by Spectroscopic Ellipsomtery," Jpn. J. Appl. Phys. Vol. 37, pp. 753-757, 1998 which is hereby incorporated by reference in its entirety. By controlling the refractive index change in different parts of a device, optical devices and interconnects may be formed as will be described below.

Figure 2:
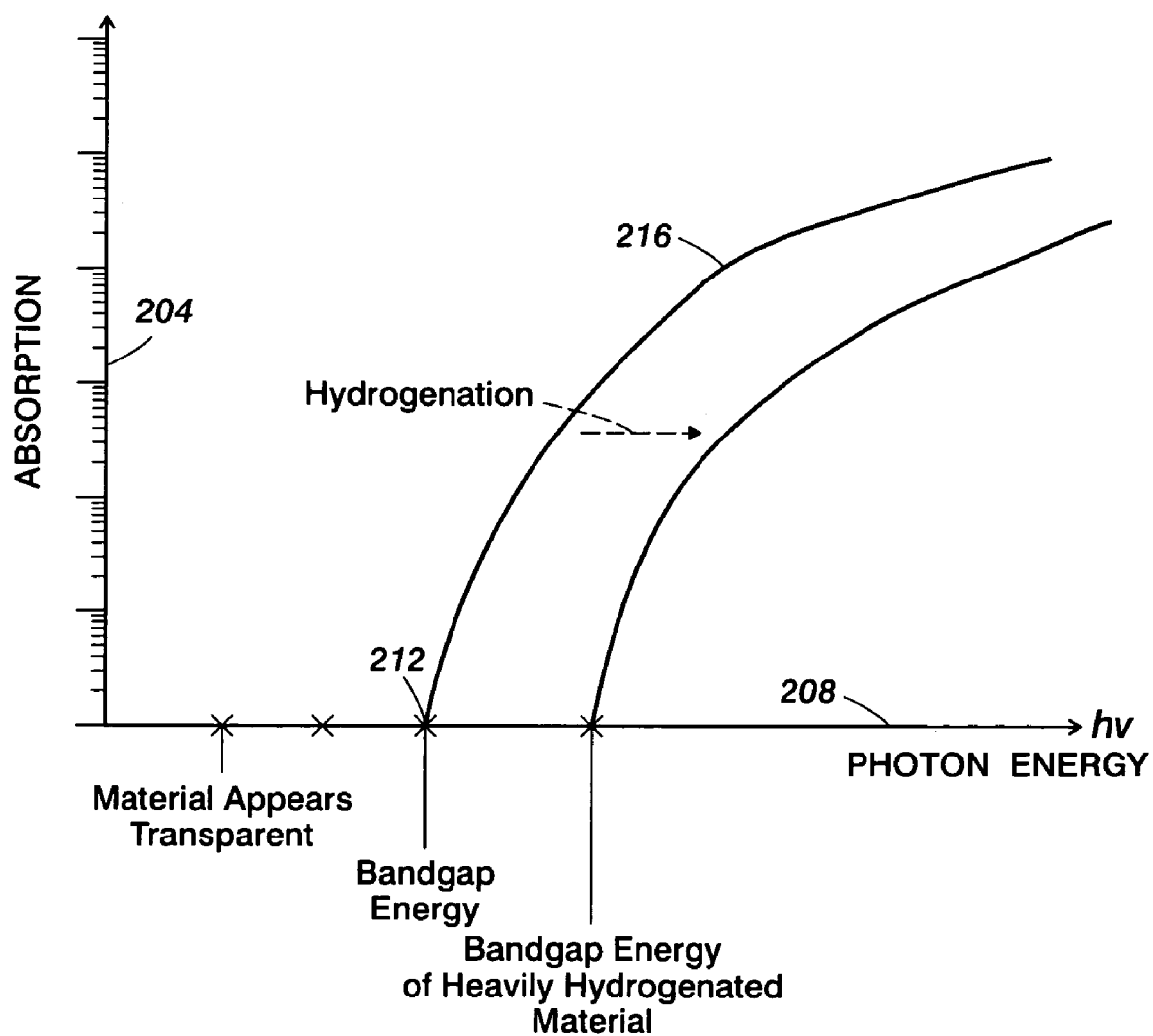
FIG. 2 shows a plot of the absorption characteristics of a semiconductor as a function of the incident photon energy.

FIG. 2 plots a material's absorption properties as a function of incident photon energy. The absorption is plotted on axis 204 and the energy of an incident photon plotted on axis 208. Photons below a bandgap energy 212 are not absorbed and thus the thus the material appears transparent to photons below bandgap energy 212. Photons with energies above the bandgap encounter some absorption. Curve 216 shows that as the photon energy increases, the absorption coefficient also increases. Changing the hydrogen concentration shifts bandgap energy 212 along axis 208 resulting in changes to the material absorption properties. As will be described, this property will be used to lower the absorption of the facets in a laser diode.

A number of applications can be made using the previously described properties. In one example, the lateral as well as vertical hydrogen concentrations are manipulated to modify the bandgap and refractive index. Step changes in the index of refraction can be used to form waveguide boundaries. However, graded or gradual index variations may also be used to form waveguides or control optical mode profiles.

Figure 22:
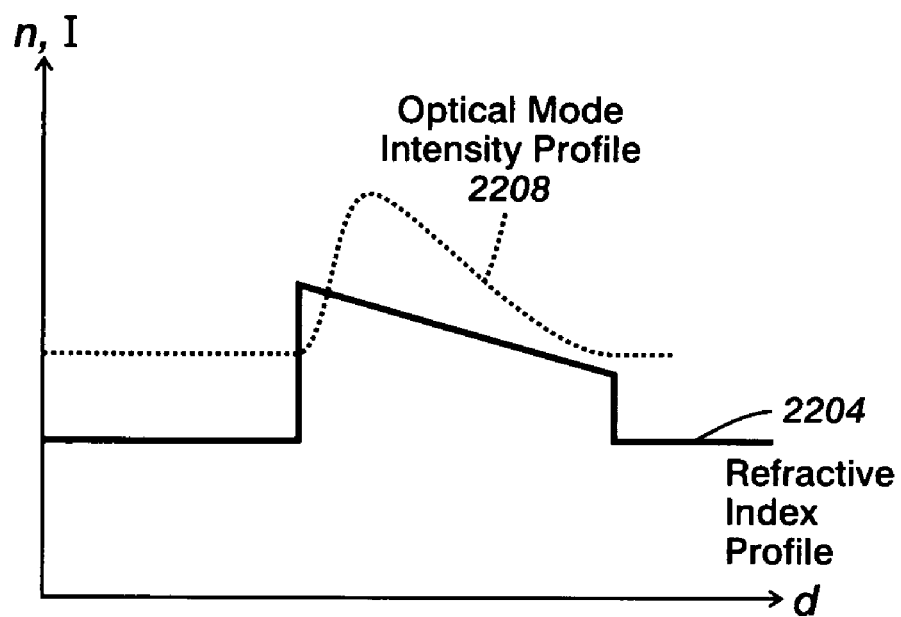
FIG. 22 shows a plot of an asymmetric index profile plotted along a lateral or vertical dimension and how the index profile affects the optical mode.
Figure 23:
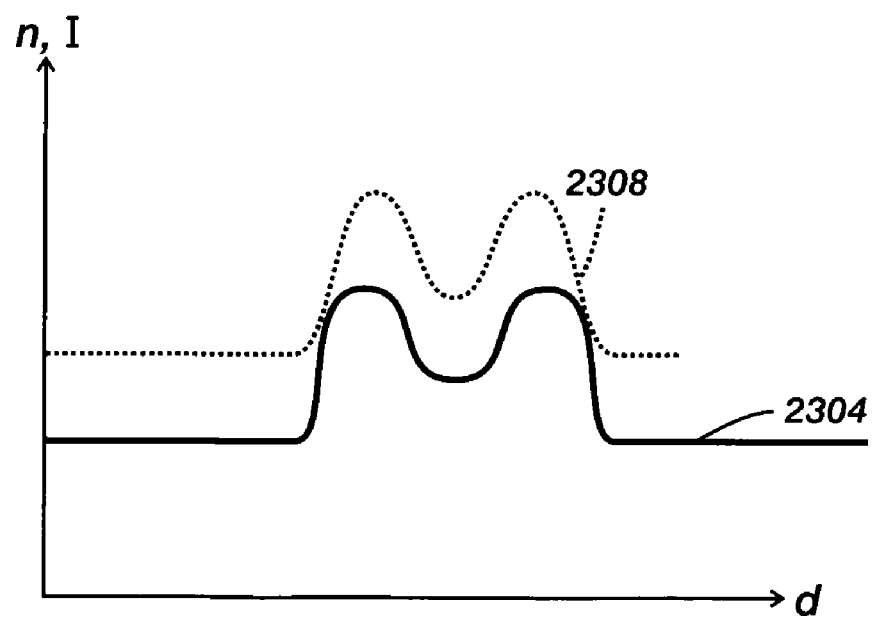
FIG. 23 shows a plot of a symmetric index profile that may be used, for example, in a beam splitter and how the index profile affects the optical mode.

One example of using index changes to control modal profile are shown in FIGS. 22 and 23. FIGS. 22 and 23 show a plot of a varied index profile 2204 and 2304 plotted along a lateral (or vertical dimension) (axis d). The index profiles affect the optical modes of light propagating through the varied index profile. Curves 2208 and 2308 show example resulting optical modes for each index variation curve. More details on the use of both the stepped index variation and the graded index variation will be described in the devices that follow.

High Power Semiconductor Light Output Devices with Low-absorbtive Facet Windows

The described methods may be used to alter the facets of semiconductor light output devices, although particular use may be found in a traditional high powered long wavelength InGaAsN system laser. As used herein, "semiconductor light output device" is broadly defined to include any device that uses a gain region of a semiconductor material to amplify or to generate light. Example semiconductor devices include lasers, amplifiers. As used herein, "facets" are broadly defined to mean the region immediately adjacent an active region through which laser light passes before exiting the laser. The facet is often made of material very similar to the active region. The "active region" is defined as the area of a semiconductor device that generates and/or amplifies light usually by stimulated or spontaneous emission of light. Thus "active region" is typically the gain medium of a laser, or an amplifier. In a LED (including superluminescent LEDs) the "active region" is usually the region in which spontaneous emission of light occurs. As previously described in the background, laser facets often absorb some of the laser's output energy. The absorbed energy heats the facet causing defects and bandgap shrinkage. The resulting defects and bandgap shrinkage increases facet energy absorption sometimes resulting in catastrophic optical damage and laser failure.

In order to avoid the catastrophic damage, one exemplary embodiment of the invention adjusts the concentration of hydrogen in the facet region. In particular, hydrogen content in the InGaAsN and/or GaAsN facet region is increased to increase the bandgap in the facet regions rendering the facet less-absorbing of photons output by a semiconductor device. In particular, facet hydrogenation makes the facet bandgap slightly larger then the bandgap of the active region.

Figure 3:
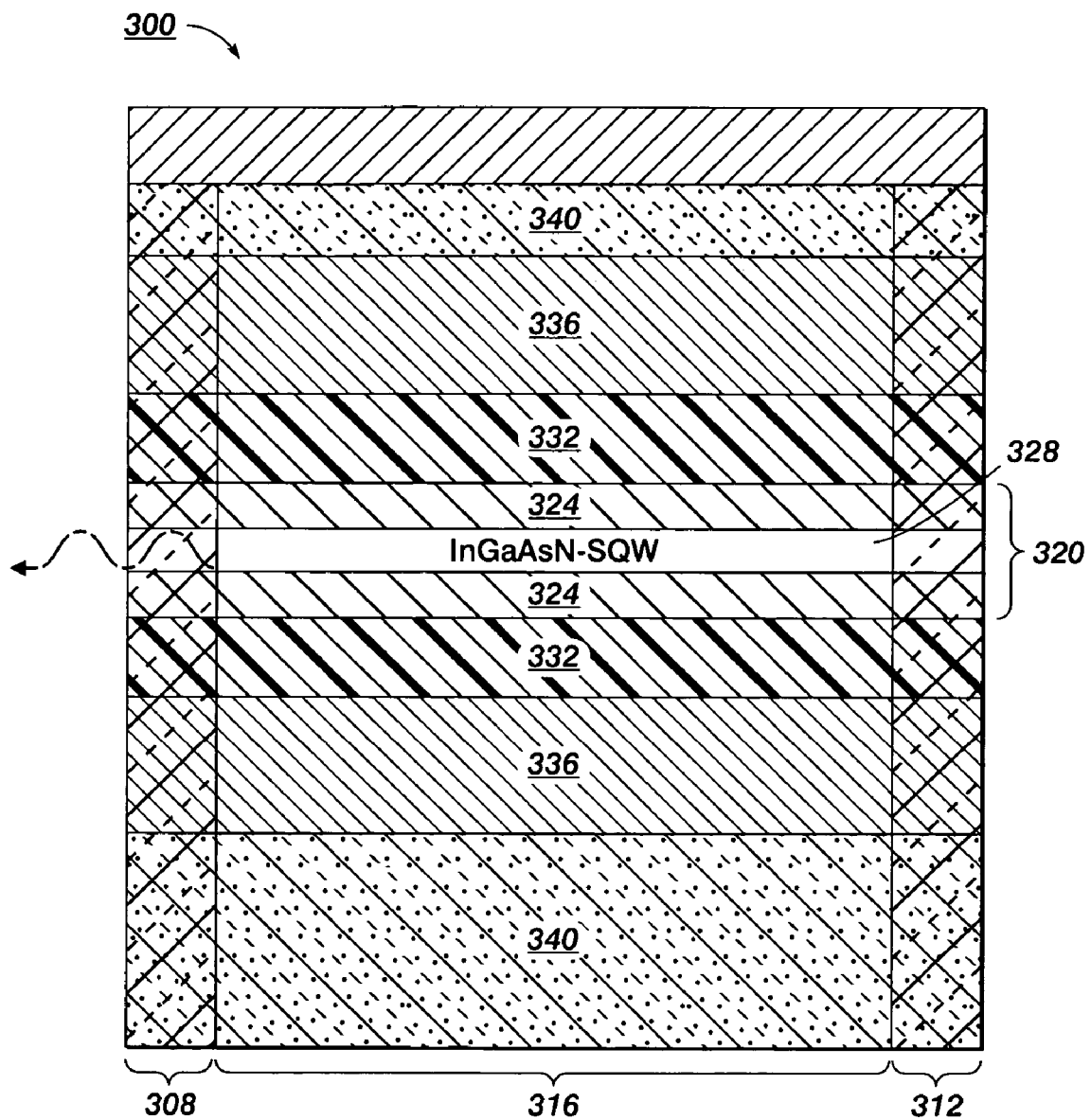
FIG. 3 shows a cross sectional view of a laser structure that relies on hydrogenated facets to minimize absorption.

Various methods may be used to change the hydrogen concentration in the facet. One method of increasing the hydrogen concentration is hydrogen implantation in the facet region. A second method is simply to allow hydrogen to diffuse into the cleaved facet region of the semiconductor laser. FIG. 3 shows a laser 300 exposed to hydrogen 304 such that the hydrogen diffuses into one or both laser facets 308, 312. Such hydrogen incorporation may be achieved by cleaving the laser to create laser ends or laser facets. The cleaved facets, typically laser facets 308 and/or 312 are then exposed to monatomic hydrogen at about 300 degrees centigrade. The rate of diffusion depends on temperature and can be modeled theoretically as described, for example, in Physics of Semiconductor Devices, $2^{nd}$ Edition, S. M. Sze, John Wiley & Sons, 1981, pp. 66-69 and in "Modeling of hydrogen diffusion in p-type GaAs:Zn", R. Rahbi, et. al., Physica B: Physics of Condensed Matter, Volume 170, Issue 1-4, p. 135-140. The diffusion behavior can be determined experimentally using standard Secondary Ion Mass Spectroscopy (SIMS) characterization techniques. A typical diffusion depth of between about 500 nm to 5 μm is desirable. A typical exposure may occur for a period of time of between 1 and 15,000 minutes in a chamber with hydrogen at a pressure of 10 to 800 torr. Facet HR coating or passivation may occur after exposure and diffusion of the hydrogen into the facet. The hydrogen levels are typically increased until a bandgap shift of between 1 meV and 100 meV is achieved.

Figure 4:
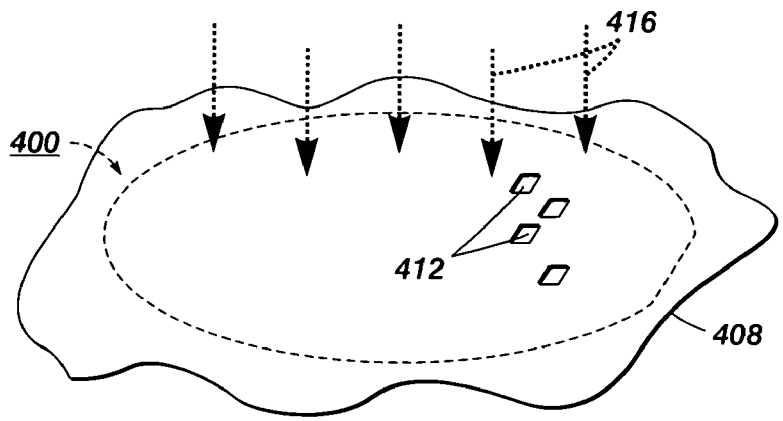
FIG. 4 shows a mask with apertures being used to control hydrogenation of a wafer.

Sometimes, processing of individual lasers is slow and a wafer level processing is needed. FIG. 4 shows one example of masking a wafer 400. In wafer level processing, the hydrogenation of the facets may be completed prior to cleaving or sawing the wafer to create individual lasers. In the embodiment shown in FIG. 4, a metal or dielectric mask 408 covers wafer 400. The mask 408 includes opening 412 positioned over where the laser will eventually be cleaved. The wafer 400 is then exposed to hydrogen atoms 416. Hydrogen atoms impinging the wafer 400 through openings 412 and diffuse into the active layers. In an alternate exemplary embodiment, ion implantation drives hydrogen into the facet area prior to laser facet cleaving. In still a third exemplary embodiment, the entire wafer is hydrogenated and hydrogen then hydrogen removed from non-facet areas. Removal may be accomplished by selective heating of non-facet areas or by masking non-facet areas with a hydrogen attracting material. After the hydrogen is embedded into the laser facets, the wafer may be cut or cleaved to form individual devices such as lasers, LEDs and the like.

In regions that include nitrogen, hydrogen increases bandgap in facets 308, 312 such that the facet bandgap is larger than the bandgap in region 316 between the facets. Thus, InGaAsN layer 320 includes a facet region 324 that has a slightly larger bandgap than active region 328. Likewise, GaAsN spacing layers 332 includes facet regions affected by hydrogenation and thus have a bandgap larger than regions that do not contain nitrogen. Examples of regions that do not contain nitrogen include AlGaAs guiding layers 336 and AlGaAs:Si cladding layers 340. A typical example hydrogen concentration in the laser facet 308, 312 region exceeds $5\times10^{16}$ hydrogen atoms/cm$^2$ which results in a bandgap shift that exceeds 20 meV. In one embodiment InGaAsN active region outputs light at 1.48 micrometer which results from a bandgap of about 0.84 eV. Very few photons of this energy are absorbed by the laser facet with a bandgap that typically exceeds 0.86 eV.

Besides increasing the bandgap, hydrogen in the facets also reduces the facet index of refraction. A reduced waveguide refractive index differential between the guiding layers 336 and the facet 308, 312 increases beam spreading at the facet. Beam spreading lowers the beam power density in the facet which also helps to reduce facet heating. In one embodiment, the lateral index of refraction in the facet is graded to provide additional control of the optical modes. The optical modes may be molded to further enhance beam spreading of light from the active region of the semiconductor device. Alternately, the optical mode may be shaped for input into a receiving device or waveguide.

High powered long wavelength high reliability lasers such as 1.48 micrometer lasers are particularly useful for optical communication systems. The 1.48 micrometer wavelength which can be generated by an InGaAsN laser, is particularly suitable for pumping erbium-doped fiber amplifiers often used in long haul optical communication systems. Such a communication system is described in Understanding Fiber Optics, $2^{nd}$ Edition, Jeff Hecht, Sams Publishing, 1993, ISBN 0-672-30350-7, pp.112-113 which is hereby incorporated by reference.

Pump wavelength at 1.48 μm allows longer and more uniform fiber amplifier gain sections compared to the alternative 980 nm pump wavelength because of lower fiber absorption at 1.48 μm. Strong absorption of the pump source at 980 nm results in weak pumping of the signal at greater distances from the laser source. Thus, InGaAsN pump lasers at 1.48 μm is desirable, and the use of hydrogenated facets in high power InGaAsN pump lasers allows these lasers to operate with long lifetimes due to minimized facet heating.

The signal wavelength in long haul communications systems is typically around 1.55 μm. InGaAsN active layers can be designed for 1.55 μm laser operation. 1.55 μm is the signal wavelength of choice in long haul fiber-optics communication systems because of the wavelength's low absorption in typical fibers. High power at 1.55 μm is advantageous because it allows the signal to travel a longer distance before requiring amplification thereby allowing fewer costly amplifiers in the communication link. Thus the high powered signal lasers that output 1.55 μm also benefit significantly from reduced facet heating. Thus both the pump lasers and the signal lasers operate under high power conditions, the reliability of which can be enhanced by minimal absorption and heating at the laser facet. The increased reliability is particularly valuable in applications involving hard to access areas such as undersea fiber links.

Burried Lateral Index Guided and Lasers with Lateral Current Blocking Layers

In order to improve the performance of semiconductor light output devices, usually semiconductor lasers, traverse index guiding mechanisms are used to laterally index guide the active region. In the following description, a hydrogenation-induced bandgap shifted (HIBS) material along at least one edge of an InGaAsN active region serves as the lateral index guiding structure. Such a structure is shown in FIG. 5.

Figure 5:
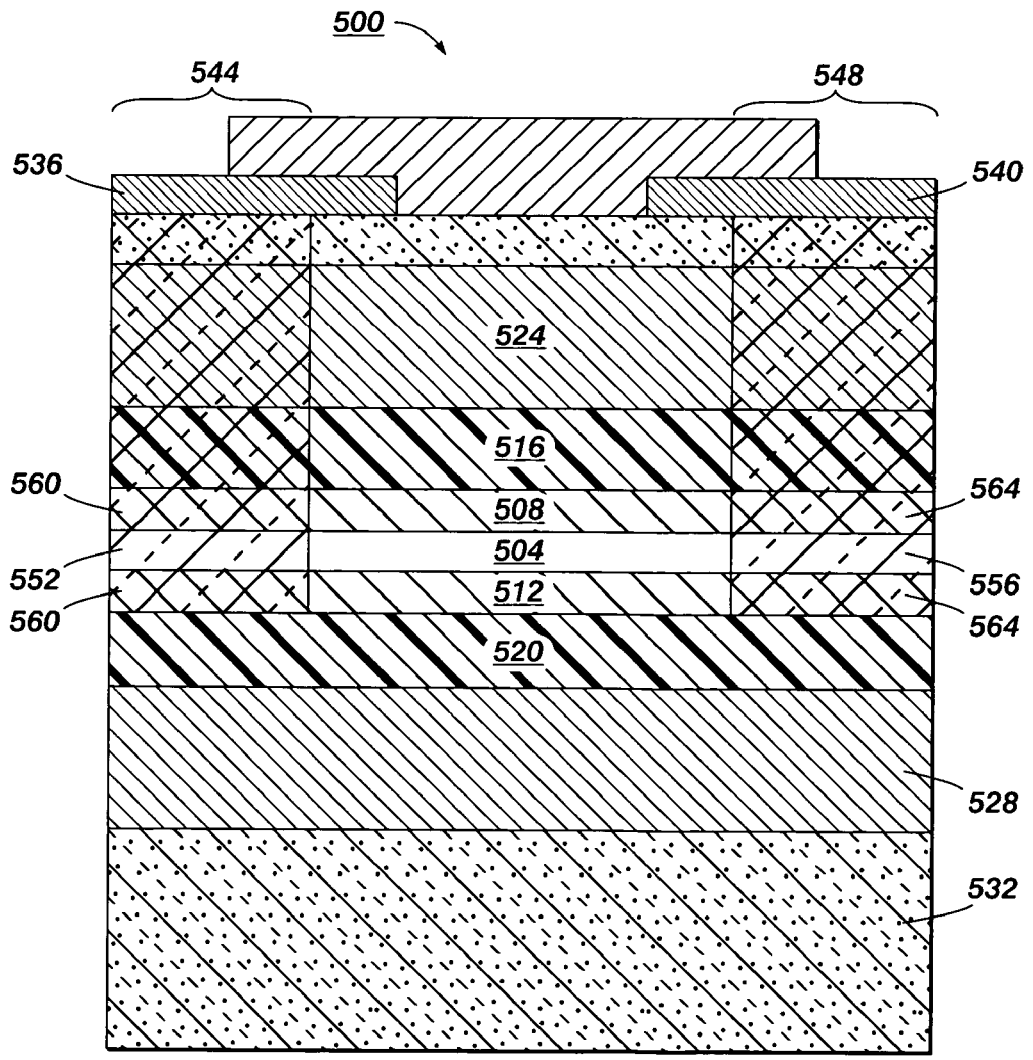
FIG. 5 shows a buried index guided laser diode structure using hydrogenated InGaAsN and GaAsN layers for lateral index guiding.

FIG. 5 shows an InGaAsN square quantum well active region 504 sandwiched between GaAs (N) spacers 508, 512 and AlGaAs cladding layers 516, 520, 524, 528. As used herein "sandwich" merely means between two layers, and not necessarily adjacent to either of the two layers. In the illustrated embodiment, closer cladding layers or guiding layers 516, 520 are undoped while lower cladding layer 524 is silicon doped and upper cladding is Carbon doped. Substrate 532 supports the structure while contacts 536, 540 allow electrical pumping of active region 504. Such an InGaAsN laser stack is described in many prior art references including U.S. Pat. No. 6,922,426 entitled "Vertical Cavity Surface Emitting Laser Including Indium in the Active Region" by Johnson which is hereby incorporated by reference.

Hydrogenated lateral region 544, 548 bordering active region 504 guides photons generated by active region 504. As used herein, "lateral" is defined as regions to the side, typically in a wafer that includes multiple layers, lateral regions to an region in a layer, (such as an active region), will be other regions in the same layer. Typically, the lateral region is made from the same material and layers as the material in other regions of the InGaAsN laser except that the lateral regions have been hydrogenated. In one embodiment, lateral regions are merely hydrogenated regions of a laser layer. Thus, when an InGaAsN active region is created from an epitaxially grown layer, the lateral regions are merely portions of the InGaAsN epitaxially grown layer that has been hydrogenated. Adding hydrogen increases the lateral region bandgap and decreases the index of refraction. Both characteristics enhance index guiding of the wave propagating in active region 504.

Various methods may be used to change the hydrogen concentration in lateral regions 544, 548. In one example method, hydrogen ion implantation is used to direct hydrogen to the target area, lateral region 544, 548 in the illustrated example. In a second example method, monatomic hydrogen may be diffused through openings in a masked wafer surface. The masking structure of FIG. 4 may be used, except that openings 412 in the mask correspond to surrounding lateral regions 544, 548 instead of laser facets. Thus, in this second method diffusion occurs in a vertical direction. In still a third method, hydrogen may be allowed to laterally diffuse from an etched ridge into surrounding lateral regions 544, 548. In particular, a ridge may be etched adjacent to lateral regions 544, 548 and the ridge exposed to a hydrogen gas. Different temperatures and pressures may be used to incorporate the hydrogen, one example of which is described in hydrogen diffusion and acceptor passivation in p-type GaAs from R Rahbi et al. APL 73 pp. 1723-1731 (1993). In the cited reference, hydrogen was diffused in the samples by exposure to a hydrogen rf plasma (13.56 MHz) at a constant pressure of 1.2 mbar. The exposure temperature was chosen in the 50-300 Centigrade range for different durations of 30 min to a few hours.

As described earlier, changing the hydrogen concentration is not limited to adding hydrogen to a region. In still a fourth method of hydrogenating the lateral regions, hydrogen may be introduced to the entire layer including active regions and lateral regions. Excessive hydrogen may then be removed, particularly from the active region, by selectively heating the active region or by placing the active region in contact with a material with a strong affinity for hydrogen.

Figures 6, 7:
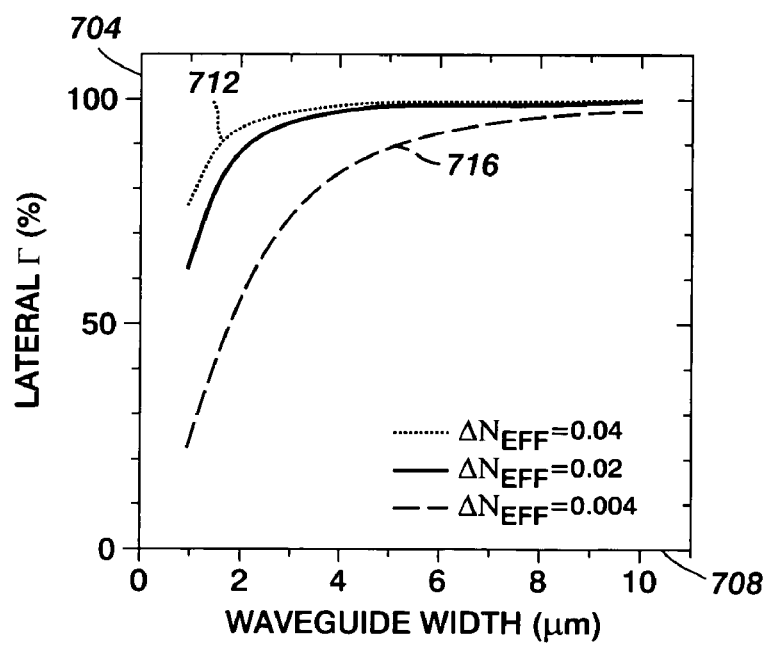
FIG. 6 is a table showing different confinement factors and effective refractive indexes for various example structures.
FIG. 7 is a plot of lateral confinement factors for a buried lateral index guided laser structure versus waveguide width for different refractive index steps.

FIG. 6 and FIG. 7 illustrate the resulting confinements that may be obtained using lateral hydrogenation. FIG. 6 shows confinement factors (ratio of the modal gain to the active region gain) and effective refractive indexes for example InGaAsN laser structures. Rows 604 and 608 of FIG. 6 shows effective index changes in which only the InGaAsN active layer lateral regions 552, 556 are hydrogenated. Rows 612 and 616 show effective index changes when both the InGaAsN active layer lateral region 552, 556 and the GaAsN spacer lateral region 560, 564 are hydrogenated resulting in an active region that is bounded on all fours sides by hydrogenated material. The sample computations are done for an 8 nm wide InGaAsN SQW active region and a 35 nm wide GaAs(N) spacer layer.

In FIG. 6, column 620 provides confinement factors and column 624 provides effective refractive indexes for a zero order mode for various exemplary structures described in Column 628. Row 604 provides the confinement factor and the effective index of refraction of the central region, including a GaAs spacer, all of which has not undergone hydrogenation. Row 608 provides the confinement factor and the effective refractive index of the adjacent surrounding lateral region when only the lateral portion of the InGaAsN active region is hydrogenated but the lateral portion of GaAs spacers have not been hydrogenated. Box 632 shows the difference in effective refractive index produced by hydrogenating only the lateral portion of the InGaAsN active region. The 0.004 effective refractive index difference provides some index guiding, however, a larger change in index would provide stronger index guiding.

An order of magnitude increase in the index differential may be achieved by not only hydrogenating the active region, but also hydrogenating the adjacent GaAsN spacer lateral region 560, 564. Row 612 provides the confinement factor and the effective index of refraction of a central region that has not undergone hydrogenation. Row 616 provides the confinement factor and the effective refractive index of the adjacent surrounding lateral region when both the lateral portion of the InGaAsN active region and the lateral portion of GaAsN spacers have been hydrogenated. Box 640 shows that an approximately 0.042 difference in effective indexes results between the effective index of a non-hydrogenated structure and the effective index of a structure where both the lateral active region and lateral spacers have been hydrogenated.

FIG. 7 plots percentage lateral confinement along axis 704 as a function of waveguide width along axis 708 for various example refractive index differences. The example data is for a laser that outputs 1.3 micrometer wavelength light. FIG. 7 illustrates that an effective refractive index of 0.04 shown in curve 712 provides significantly greater lateral confinement at smaller waveguide widths than an effective refractive index of 0.004 shown by curve 716. The advantage is less pronounced when wider waveguides are used, however wider active areas are typically not preferred due to difficulties with carrier confinement.

Surrounding the active region with higher bandgap materials not only provides optical index guiding, the higher bandgap can also improve lateral carrier confinement because the lateral increase in the bandgap energy prevents or at least reduces lateral diffusion of the injected carriers. Carrier confinement becomes exponentially more effective with increasing band offsets, so it is desirable to maximize the band offset by incorporating as much hydrogen in the lateral cladding area as practically possible. The physics of carrier confinement is described in, for example, chapter 3 of Physics of Optoelectronic Devices, by Shun Lien Chuang, John Wiley & Sons, 1995, ISBN 0-471-10939-8. Carrier blocking regions enable more efficient current injection resulting in higher power conversion efficiency. Higher efficiencies enable narrower waveguide regions for single mode devices because fewer carriers are lost to lateral diffusion. In order to further enhance current blocking, nitrogen may be used not only in the active light-emitting layers, but also in adjacent cladding and waveguide layers. Introducing nitrogen into the cladding layers allows hydrogenation to bandgap shift a thicker layer and thus further improving lateral carrier confinement.

Figure 8:
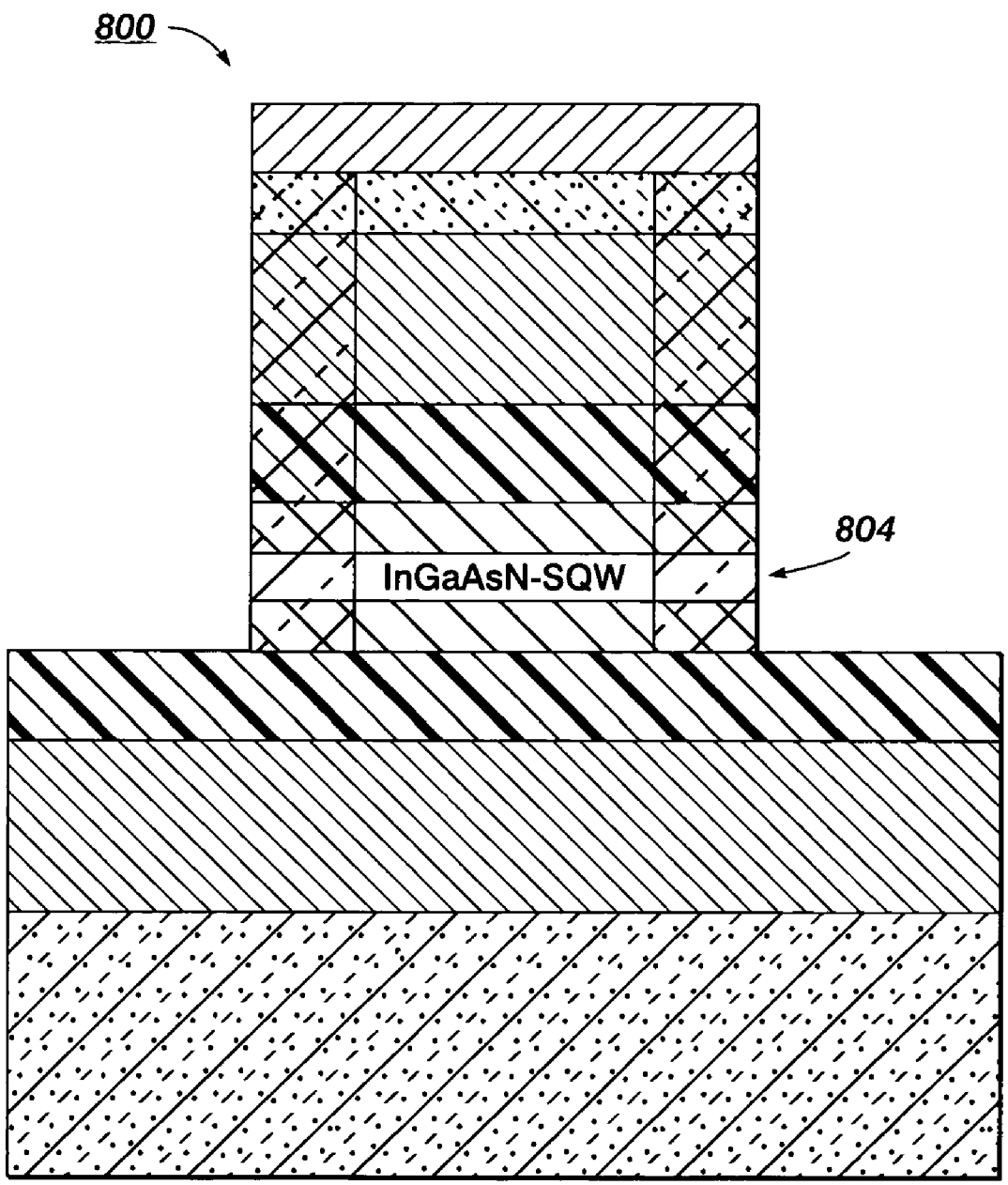
FIG. 8 shows an example of a ridge-waveguide laser diode.

Although FIG. 5 shows a buried index guided laser diode structure, it should be understood that the described index guiding and current confining properties may also be used for other laser types. For example, the described hydrogenation techniques may be used in ridge-waveguide laser diode shown in FIG. 8. In ridge-waveguide laser diodes, hydrogenation can be done by simple diffusion from the etched ridge 804. The hydrogenation in this example provides an additional "soft" confinement of the optical mode which reduces e.g. light scattering at the etched mesa edges. Alternate gradual control of hydrogenation will be described in connection with waveguides in FIG. 14 and the accompanying description, although the gradual hydrogenation control may also be used to guide the signals in the active region of a laser.

Variable Wavelength Lasers and Laser Arrays.

As modern networks need to carry more information on optical fibers, Wavelength division multiplexing (WDM) emerged as an important method of increasing the carrying capacity of an optical fiber. In WDM, different wavelengths of light are simultaneously transmitted on a common fiber. Each wavelength carries its own information. The different wavelengths are separated or demultiplexed by devices at a receiving end of the fiber. A typical DMW system uses several semiconductor light output sources, typically semiconductor laser sources that emit at different wavelengths. One example WDM system uses an array of lasers that together are capable of outputting over 100 wavelengths spanning a range from 1525 nm to about 1600 nm. Eventually, WDM systems are expected to encompass the S-band nearing 1300 nm, the wavelength approximately output by InGaAsN systems. However, fabricating the laser array to output the many different wavelength outputs is difficult and thus expensive.

Laser wavelength output depends on several factors. Typically a laser tends to lase at the mode frequency with the greatest net gain (net gain=stimulated emission minus optical losses), see, Yariv, A. 1991 Optical Electronics, $4^{th}$ edition (Holt, Rinehart and Winston). Thus, selecting an output wavelength involves adjusting the greatest net gain position.

Figure 9:
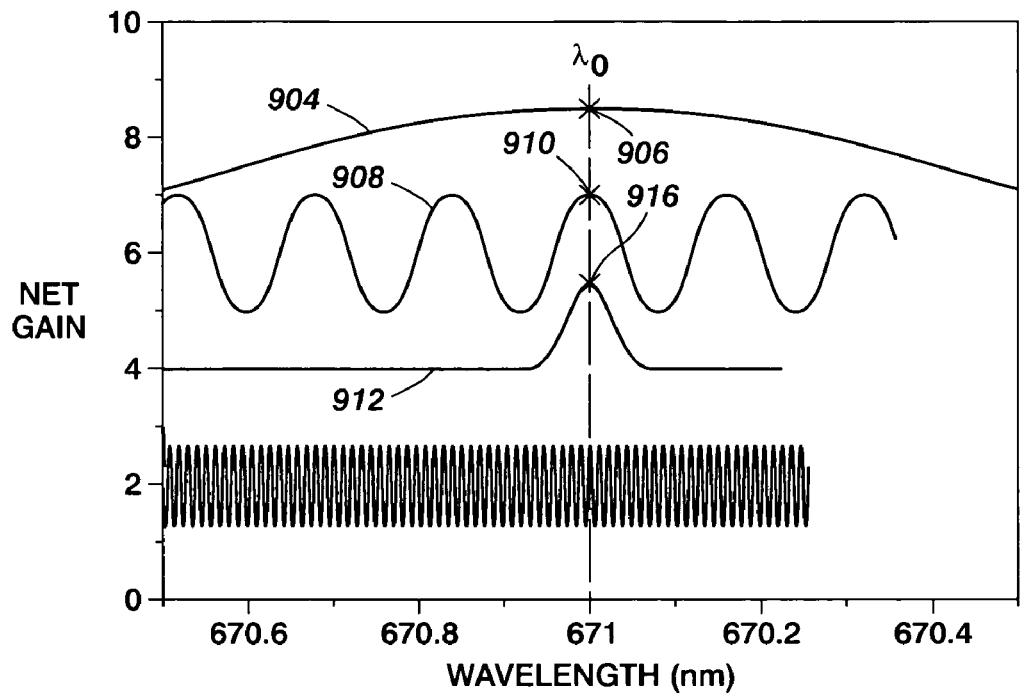
FIG. 9 is a schematic that shows different contributions to the net optical gain of a laser as a function of wavelength.

FIG. 9 shows the various elements that can go into determining the net gain. Net gain is typically determined by the sum of the material gain shown in curve 904 and a free spectral range curve shown in curve 908. Curve 904 shows the gain in the active material. A peak 906 of material gain curve 904 typically corresponds to the bandgap of the active material where the average output energy of a photon is approximately equivalent to the bandgap. Curve 908 corresponds to the free spectral range of the laser which is determined by the active material laser cavity dimensions. The laser output typically stabilizes at a frequency at the spectral range peak 910 that is closest to active material peak 906. Thus by adjusting the bandgap of the active material using hydrogenation, the output of the laser may be selected.

Figure 10:
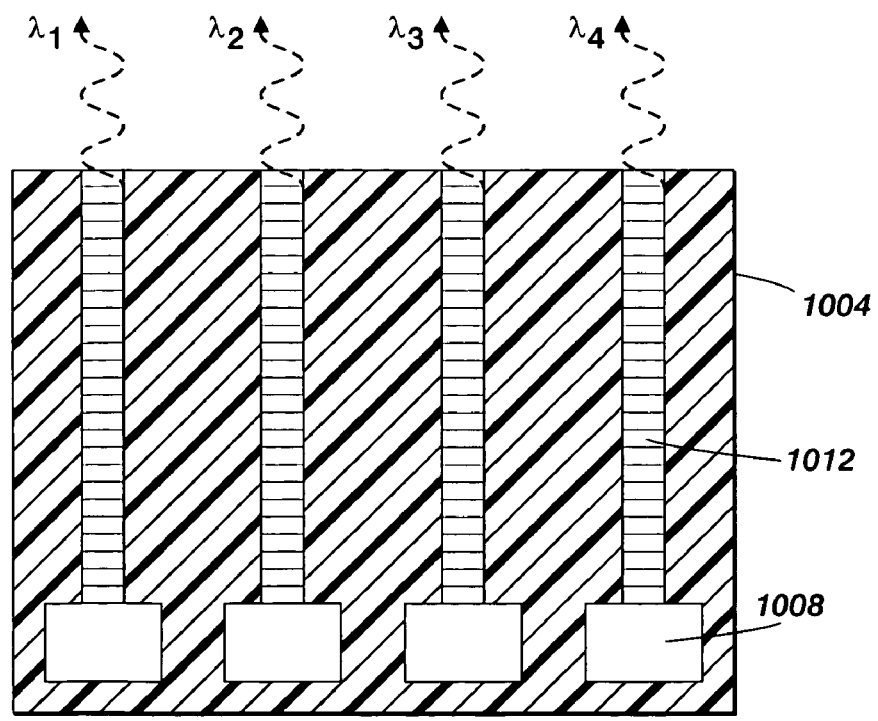
FIG. 10 shows an array of lasers coupled to gratings, each laser outputs a different frequency of light, all lasers may be on the same wafer.

One problem with the illustrated structure is that the peak gain of the active material shifts with temperature. FIG. 10 shows an example array of semiconductor lasers including a semiconductor laser cavity 1004 surrounding active material 1008. Furthermore, processing changes make it difficult to repeatedly create a bandgap peak at a desired frequency. Thus a grating may be added to provide feedback to each laser in the laser system. In FIG. 10, each semiconductor laser outputs light into a corresponding grating 1012. The grating provides a feedback signal that determines the laser mode selected. This type of laser is called the distributed Bragg reflector (DBR) laser. A discussion of how mode selection is determined relative to grating dimensions and material parameters is given in, for example, pp. 95-101, Diode lasers and Photonic Integrated Circuits, by Larry Coldren and Scott Corzine, John Wiley & Sons, 1995, ISBN 0-471-11875-3. The feedback provided by grating 1012 is graphically illustrated by curve 912 of FIG. 9 where the laser output wavelength is determined by grating feedback peak 916.

When fabricating an array of different lasers with different output wavelengths for a WDM system, different gratings are used to produce the different laser outputs. One fabrication challenge is to approximately match active material curve peak 906 to the grating feedback peak 916. Peak mismatches result in inefficiencies, and in the worst case, insufficient total gain to maintain continuous stimulated emission output. Thus, the active material bandgap should be adjusted thereby adjusting active material curve peak 906 to approximately match grating feedback peak 916.

One method of adjusting active material curve peak 906 is to change the growth recipe of each laser device. In particular, the active layer of each laser may differ according to the desired output frequency. The variation may be achieved by varying the epitaxial growth of each active layer as described in U.S. Pat. No. 4,839,899 entitled "Wavelength Tuning of Multiple Quantum Well (MQW) Heterostructure Lasers" by Burnham et al. which is hereby incorporated by reference. However, this multiple recipe approach is difficult to implement in manufacturing settings. In particular, applying different recipes can result in delays and reproducibility problems associated with recipe changes. As used herein, recipe means any sequence of instructions and parameters used to form a particular device. Multiple recipes also increase costs due to the increased length of time required to build the device.

Instead of altering each active region during growth, one exemplary embodiment of the invention adjusts the wavelength output of each laser by hydrogenation-induced bandgap tuning (hereinafter HIBS). HIBS adjusts the bandgap of each InGaAsN laser by changing the amount of hydrogen in each laser's active region. Use of HIBS allows multiple lasers designed to output different wavelengths to be grown using the same reactor and the same recipe and even on the same common InGaAsN layer. After growth, the hydrogen content in each active region of each laser is adjusted. As previously described and illustrated in FIG. 1, increasing the hydrogen concentration increases the bandgap of the InGaAsN/GaAs quantum wells thereby shortening the wavelength at which active material peak 906 will occur. Thus shorter wavelength lasers with higher hydrogen concentrations in the active material will correspond to lasers that output shorter wavelength light and are thus coupled to gratings with shorter periodicities or spacings between adjacent grates.

The same hydrogenation and grating shift techniques used DBR lasers may also be used in Distributed Feedback Lasers (DFB). In a DFB laser, the gratings are formed above the active layer instead of beyond it as in DBR lasers. DFB lasers are described in, for example, pp. 102-108, Diode lasers and Photonic Integrated Circuits, by Larry Coldren and Scott Corzine, John Wiley & Sons, 1995, ISBN 0-471-11875-3 which is hereby incorporated by reference.

Using the above described methods, an InGaAsN laser may typically be tuned in a range from 1.3 to 1.55 micrometers. The hydrogen concentration determines the output frequency which determines the grating spacing used. For example, if an InGaAsN laser is designed to output a wavelength of 1.55 μm, a typical grating pitch separation of about 502 nm (half wavelength pitch with 114.7 nm of epi and 387.5 nm air gap) is appropriate. The actual grating separation can be scaled according to the material refractive index to produce half wavelength pitch separation if materials other than air are used between grating features. Higher order grating geometries where the pitch is made an integer number of half wavelengths is also possible. Shorter wavelength emitters on the same substrate have grating pitches accordingly scaled shorter to maintain a half wavelength pitch.

In one embodiment, the active material is hydrogenated to shift the peak material gain closer to the target wavelength. FIG. 1 approximates the amount of hydrogen needed for a desired shift. Increasing hydrogen concentrations increases the bandgap towards that of a nitrogen-free alloy. Bandgap adjustments of up to 50 meV may be obtained at sufficiently high hydrogen dosage for $In_{0.34}Ga_{0.66}As_{1-y}N_y$ with a nitrogen content y of 0.007. Larger nitrogen concentrations enable even larger bandgap shifts by hydrogenation.

Figure 11:
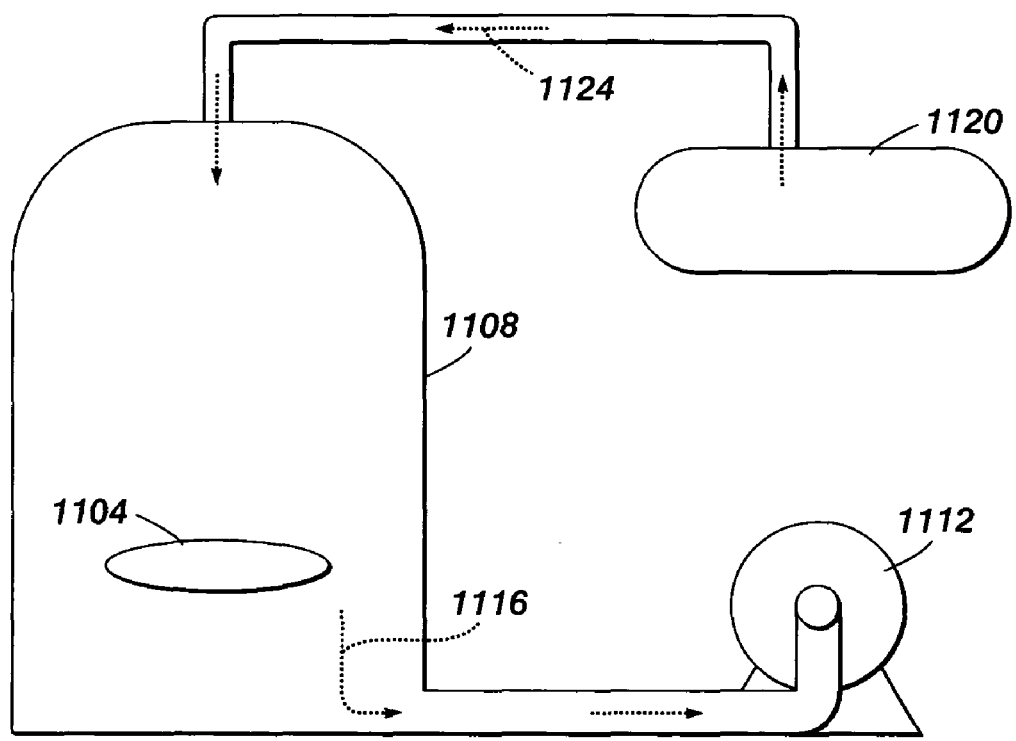
FIG. 11 shows a wafer in a vacuum chamber as one method of selectively hydrogenating regions of a wafer.

Various methods may be used to change the hydrogen content in the active region of a semiconductor laser. One previously described technique uses ion implantation. Another method that is particularly suitable to fabricating multiple semiconductor lasers on a wafer that output different wavelengths is to form a mask over the wafer. FIG. 11 shows a set up that may be used to hydrogenate laser active regions of a wafer.

In FIG. 11, a wafer 1104 is placed in a vacuum chamber 1108. By providing different level of hydrogenation various devices can be fabricated thereon based on a single common epitaxial layer, such as semiconductor lasers, amplifiers, detectors, waveguides and similar structures. A vacuum pump 1112 removes reactive and other unnecessary gasses along flow path 1116. A hydrogen source 1120 provides hydrogen. Hydrogen source may typically obtain the hydrogen by many methods, including electrolysis of water or decomposition of ammonia. Also $H_2$ or plasma hydrogenation could be used. Hydrogen is provided along flow path 1124 into vacuum chamber 1108. The wafer is heated to a temperature between 150 and 500 degrees centigrade, and more typically between 250 and 400 degrees centigrade to facilitate diffusion of hydrogen into the wafer. The exposure period varies according to the level of hydrogenation desired.

Figure 12:
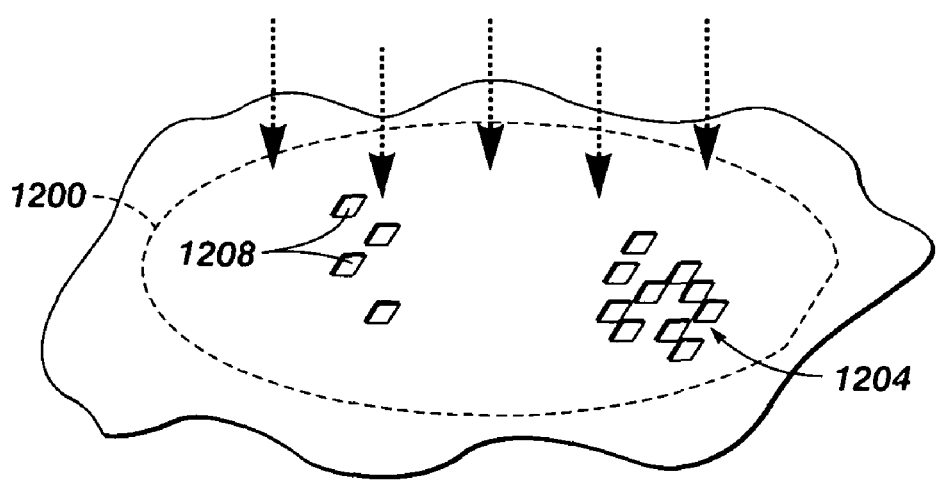
FIG. 12 shows a half tone mask using different aperture densities to control hydrogenation of a wafer.

A mask deposited over wafer 1104 may include apertures that correspond to the active regions of each laser. In one embodiment, a half tone mask with different density of apertures or openings over each active region may be used. Areas with a higher density of apertures will result in higher levels of hydrogen incorporation and undergo a larger bandgap shift. FIG. 12 shows an example mask that includes aperture regions 1204 and 1208. The higher density of openings in aperture region 1204 results in a higher hydrogen density and thus a larger bandgap. Thus the laser that will be associated with aperture region 1204 will output a shorter wavelength. In alternate embodiments, the apertures may be different sizes with larger apertures being used to simulate a higher density of apertures. In still a third alternative embodiment, instead of apertures, the mask may be made of a material partially permeable to hydrogen such that the rate of hydrogen flow is controlled by the thickness of the mask.

Post Growth VCSEL Tuning

Figure 13:
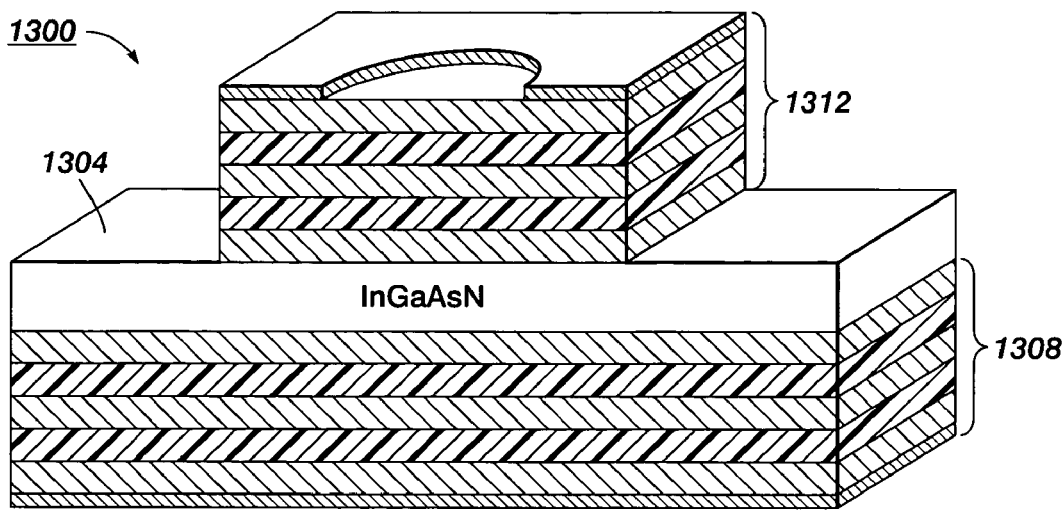
FIG. 13 shows a VCSEL where the hydrogen content of the active region may be adjusted to tune the frequency of the laser output.

The described method of tuning a semiconductor light output device, typically an active region of a laser is not limited to edge emitting lasers or even lasers. The tuning technique described may also be used for the tuning of the active region of almost any semiconductor device that outputs light including, but not limited to light emitting diodes (LEDs including superluminescent LEDs), amplifiers and vertical cavity surface emitting lasers (hereinafter VCSEL). An example VCSEL 1300 shown in FIG. 13. The VCSEL tuning may occur during or after VCSEL device fabrication.

A VCSEL typically includes an active region, here an InGaAsN active cavity 1304. A bottom set of distributed brag reflectors (DBR mirrors) 1308 supports a bottom surface of active cavity 1304. In the illustrated embodiment, bottom set of DBR mirror stack 1308 includes 35 pairs of DBR mirrors typically formed from AlGaAs. An upper set of DBR mirror stack 1312 bounds a top surface of active cavity 1304. In the illustrated embodiment, upper DBR mirror stack 1312 include approximately 25 DBR mirror pairs formed from AlGaAs.

The DBR mirror stacks are similar to gratings in that the stack feeds back a particular frequency of laser light equivalent to grating curve 912 of FIG. 9. The vertical dimensions of active cavity 1304 determine the free spectral range or internal cavity curve 908 of FIG. 9. In one embodiment, it is desired that the thickness of the active cavity 1304 be approximately three times the wavelength of the desired VCSEL light output.

Low cost coarse WDM systems typically have wavelength spacings of about 25 nm between channels, while dense WDM systems use wavelength spacings of less than 4 nm. However during actual fabrication it is difficult to form the cavity structure with such precision. Thus, wavelength differences from run to run and wafer to wafer are unavoidable due to layer thickness and material composition variations that occur during epitaxial growth. Emission wavelength differences of up to many tens of nanometers are not unusual, even among devices on the same wafer.

In order to compensate for those wavelength differences, the active material in VCSEL active cavity 1304 may be exposed to hydrogen (or hydrogen removed) to compensate for the variations which occur during processing. In particular, out of specification VCSELs may have hydrogen concentrations adjusted (either increased or decreased) to "tune" the VCSEL to output the desired frequency.

The mechanism of how a VCSEL wavelength is changed using hydrogenation was described by FIG. 9 and the accompanying description. The VCSEL laser cavity 1304 may be viewed as a structure similar to active laser cavity 1008 except that the wave propagation in VCSEL 1304 is in a vertical direction. Thus, similar to tuning laser cavity 1008, the output wavelength of the VCSEL may be tuned by shifting curve 908 of FIG. 9 such that the peak occurs at or near the desired frequency. Thus, if the wavelength output by a VCSEL is too long, the output wavelength may be reduced by increasing the hydrogen concentration in the InGaASN/GaAS quantum well. If the output wavelength is too short, hydrogen may be removed from the active region. As previous described, increased hydrogen concentration increases the active material bandgap resulting in a shorter wavelength output.

Various methods may be used to adjust the hydrogen concentration in the VCSEL. In one embodiment tuning is done by exposing the VCSEL to hydrogen. In particular, the VCSEL may be exposed to a hydrogen gas at a temperature of 300 degrees centigrade to facilitate incorporation of hydrogen. Alternately, hydrogen ion implantation may be used to embed hydrogen atoms into the material. In still an alternate embodiment, hydrogen may be incorporated into the VCSEL structure during epitaxial growth, and the adjustment may consist of annealing out excess hydrogen to tune the VCSEL after fabrication.

The VCSEL material is grown by Metal Organic Vapor Phase Epitaxy (MOCVD), where hydride precursor gases such as ammonia are typically employed. Moreover, hydrogen is usually the carrier gas of choice for flowing metal organics for building the epitaxial structure. The hydrogen-rich environment in the entire growth process makes it easy to incorporate hydrogen into the material during epitaxial growth. Excess hydrogen can then be driven out of the system by annealing the material at about 500 deg. C. or above during device fabrication.

In the case of ion implantation, selective areas of the material can be masked off by photoresist during device fabrication. The unmasked surfaces can then be exposed to standard hydrogen ion implantation accelerated at, typically, between 50 KeV to 350 KeV depending on the penetration depth desired. In practice, the exact dosage and energy levels required is determined experimentally using Secondary Ion Mass Spectroscopy (SIMS) characterization in conjunction with electroluminescence measurements. Monte Carlo computer simulation techniques using software such as the popular SRIM and TRIM packages can also be employed to model the ion implantation process.

Although the prior description has focused on tuning a VCSEL, other application of hydrogenation in VCSEL fabrication are also valuable. For example, hydrogenation may be used to adjust the lateral index profile in a VCSEL structure to improve the electrical and optical confinement as previously described for an edge emitter laser. Hydrogenation can also be used to stabilize the polarization of the light output of a VCSEL. In particular, hydrogenation may be used to create refractive index asymmetries in the VCSEL aperture. These asymmetries can be used to control the polarization of the output. An example of controlling polarization by creating asymmetries is discussed in U.S. Pat. No. 6,304,588 entitled "Method and Apparatus for Eliminating Polarization Instability in Laterally-Oxidized VCSELs" by Chua et al which is hereby incorporated by reference in its entirety. In this case, the same techniques may be used, however instead of lateral oxidation, a hydrogenation process is used is used to create the asymmetries.

Linking Circuitry:

An additional application of Hydrogen induced bandgap and index changes (HIBs) is to create passive optical and integrated optic components on the same wafer as active elements. Various passive and active elements can be formed on the same wafer and even in the same epitaxial layer. This is accomplished by selective area hydrogenation (or dehydrogenation) during device/circuit fabrication.

Passive optical elements such as waveguides are often used to interconnect devices. One method of forming such a waveguide is on a semiconductor wafer. To create a waveguide, vertical and lateral optical confinement is needed. The layer structure of the wafer provides vertical optical confinement. Vertical confinement dimensions in such waveguides are usually much smaller (typically <1 µm) than the lateral dimensions (few µm to tens of µm). Thus the index changes used to maintain single mode operation of the waveguide are larger in the vertical than in lateral dimensions. The index profile in vertical direction is given by the layer structure and can therefore be controlled precisely by adjusting appropriate growth parameter (layer thickness and composition). The relatively small index changes in lateral dimensions are usually produced by etching a ridge in the upper cladding layer to produce a lateral effective index change. Etching a ridge involves very well controlled etching. An alternate approach use narrower lateral dimensions by etching a deep ridge through the waveguide core. In order to maintain single mode operation a higher bandgap epitaxial material is usually grown beside the ridge with a subsequent regrowth step. However, the regrowth results in a non-planar morphology of regrown structures.

Hydrogen induced bandgap and refractive index shifting of an InGaAsN waveguide layer offers a simple planar processing technique for fabricating passive optical components as well as integrating the passive optical components with active components. As used herein, passive components are broadly defined to include waveguides and similar elements including, but not limited to beam splitter, coupler and taper structures. Passive elements do not undergo electrical stimulation to generate light. Conversely, "active components" are defined as any component that generates light or an electrical signal output from an energy input such as an optical pump or an electrical current. Example active devices include but are not limited to lasers, optical amplifiers, LEDs, electro optical intensity or phase modulators and photo detectors.

Many active elements as well as the passive elements can be fabricated from the same layer and even the same epitaxial layer structure. Usually the most complex component (e.g. laser structure) determine the layer structure. Compromises to allow the fabrication of different active elements are sometimes necessary. Hydrogenation processes define the areas used for the different components. In general, hydrogenation is avoided within laser, amplifier and photo diode sections. In other devices such as modulators, a low hydrogenation dose is used to shift the band gap. A medium hydrogenation may be used for most passive elements such as waveguides and a strong hydrogenation around the various components to help confine the optical and electrical signals.

Hydrogenation induced band gap and refractive index shifts can also be used to create a desired lateral or modify a given vertical mode profile within a waveguide components. For example, the index shown in curve 2304 of FIG. 23 may be used within a beamsplitter to concentrate the modes into two primary lobes prior to splitting. The index shown in curve

2204 of FIG. 22 may be used to direct optical energy to one side of a waveguide when an asymmetric distribution of light in a waveguide is to be used at the perimeter or "lateral edges" of the active and passive components, a step or other sharply defined hydrogenation profile can be used to create an optical confining barrier. Alternately, a more gradual hydrogenation may be used to create a desired index profile and therefore to design a desired lateral light distribution. Graded index changes may be used to optimize matches between the optical mode profiles in the various different components and waveguides.

Figure 14:
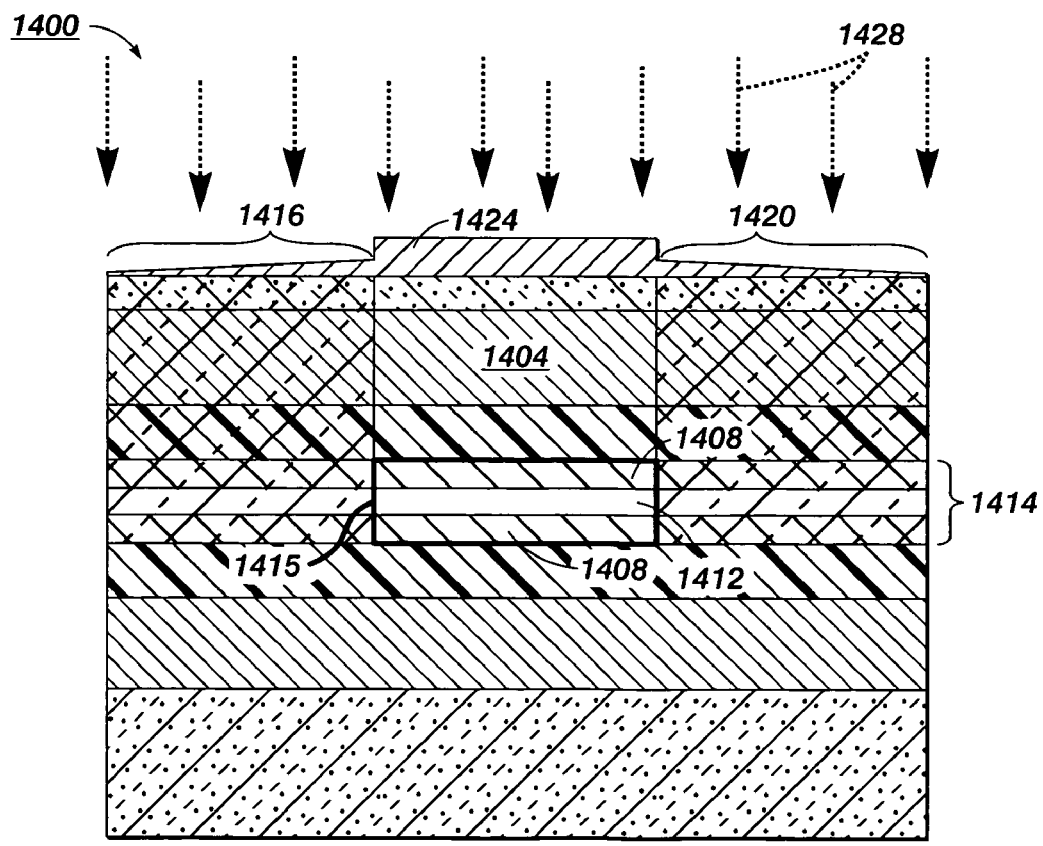
FIG. 14 shows a cross sectional view of an index guided optical waveguide where a half tone mask is used to create a desired lateral index variation.

FIG. 14 shows a front cross sectional view of a passive waveguide. In FIG. 14, the waveguide 1400 is formed on a wafer upon which lasers similar to the laser structure of FIG. 5 has been formed. Thus in the example embodiment, laser component layers including cladding layers 1404, spacer layers 1408 and active layers 1412 are already deposited The waveguide of FIG. 14 uses the layers that already exist on the wafer to form a waveguide.

In waveguide 1400, spacer layer 1408 and active layer 1412 can together collectively serve as a set of passive waveguide "core" layers 1414. The layer structure provides vertical optical confinement. Adjusting hydrogen concentrations in lateral regions 1416, 1420 creates a lateral variation in the refractive index in nitrogen containing layers, specifically the core layers. By laterally confining a portion of core layer 1414, the actual waveguide core 1415 can be formed. In one exemplary embodiment, because the waveguide core is fabricated from the core layer which is the same layer used to form a laser active region, both the laser active region and the waveguide core 1400 have approximately the same composition.

In FIG. 14, a half tone or gray scale mask 1424 determines the lateral index profile. When exposed to hydrogen 1428, mask 1424 is toned to control hydrogen diffusion into the waveguide core layers. As used herein, "toned" is broadly defined to mean any of many methods to control the flow of hydrogen through a mask region. In one exemplary embodiment, such toning may be done by making the tone mask thicker in areas in which less hydrogen is desired, and thinner in areas where more hydrogen is needed. An example of such a suitable toning material is photoresist patterned using grayscale photolithography, a well-known micro-machining processing technique. At sufficiently high temperature hydrogen is able to penetrate most materials. However, in practice relative penetration is the most important factor. Thus using a material with varying thickness as a gray scale mask should work for many materials. Examples are $SiO_2$ which has been used for masked hydrogenation of QW lasers (see e.g., Jackson et al, APL 51, 1629 (1987) or Polyimide which has been used for hydrogenated-channel FETs (e.g., see Constant et al, Electron. Lett. 23, 841 (1987).

In another exemplary embodiment "toning" may mean the mask material is relatively impervious to hydrogen, but the mask may include small apertures that allow hydrogen to pass through such that areas higher hydrogen concentration are "toned" to allow more hydrogen through by having a higher concentration of apertures as originally shown in FIG. 12 or by using larger apertures.

The lateral distribution of hydrogen in the core layers around the actual waveguide core determines the lateral index of refraction profile. The lateral index profile determines the shape of the optical mode propagating in the core and thus the optical mode propagating in the waveguide. By controlling the lateral distribution of hydrogen in the core layer, waveguide 1400 may be made into a single mode waveguide. Single mode waveguides are particularly useful for providing stable conditions (no noise due to light coupling between different modes) for accepting light from or coupling light into other elements including, but not limited to lasers modulators, glass fiber optic cables and light detectors.

In the example embodiment of FIG. 14, mask 1424 gradually and a symmetrically thins with increasing distance from the waveguide core. The thinning mask causes the hydrogen concentration and thus the refractive index to gradually increase with increasing distance from the waveguide core. Although symmetry may be desirable for a standard waveguide, other applications may prefer an asymmetrical mask toning and thus an asymmetrical hydrogen distribution in lateral regions 1416 and region 1420. By making a toning less gradual on one side, a steeper change in index of refraction may be achieved on the one side. A steeper index change results in higher modal confinement on the one side. The higher modal confinement is useful in certain applications. For example, when an asymmetrical beam splitter is needed, tighter modal confinement on one side pulls more light to the one side prior to splitting. In some cases even very asymmetric light distribution are desired. This can for example be achieved by having an index gradient all over the core region and not only an asymmetric profile at the edges. Such a situation is sketched in FIG. 22.

As previously described, vertical confinement is usually achieved by the different layer materials. In a laser, the confinement in both the lateral and vertical direction is typically very tight to facilitate electrical pumping current and optical waveguide overlap. However, after entering a passive waveguide, electrical and optical overlap is no longer needed. Thus the waveguide vertical and lateral confinement characteristics may be adjusted to enhance optical coupling between the waveguide and devices coupled to the waveguide. Thus a method of adjusting the vertical confinement factors will be described.

Figure 15A:
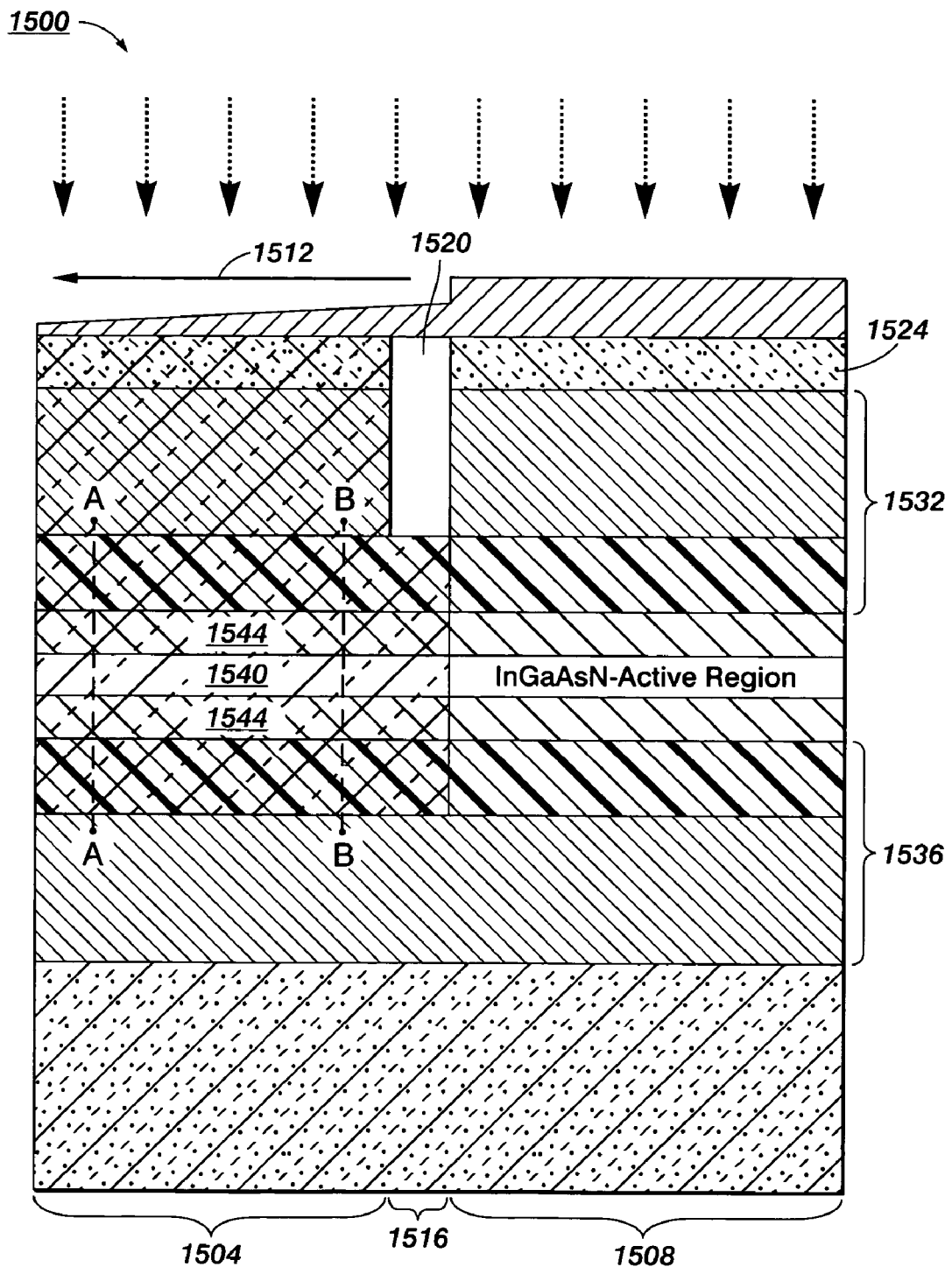
FIG. 15A is a side cross sectional view of the integration of an optical waveguide with a laser diode. A half tone mask is used in this case to gradually modify the lateral and vertical index profile.

FIG. 15A shows a side cross sectional view of a semiconductor DFB or DBR laser 1508 positioned such that a facet 1516 is oriented to direct light into waveguide 1504. In one embodiment, FIG. 15A may be a side cross sectional view along the core of the waveguide; whereas FIG. 14 shows a cross sectional view perpendicular to the waveguide direction of the same waveguide 1400. A slight trench 1520 is etched between the laser 1508 and waveguide 1504. Trench 1520 facilitates electrical confinement and isolation by preventing current from traveling from contact 1524 through the passive waveguide 1504, thus helping to confine current to semiconductor laser 1508.

Figure 15B:
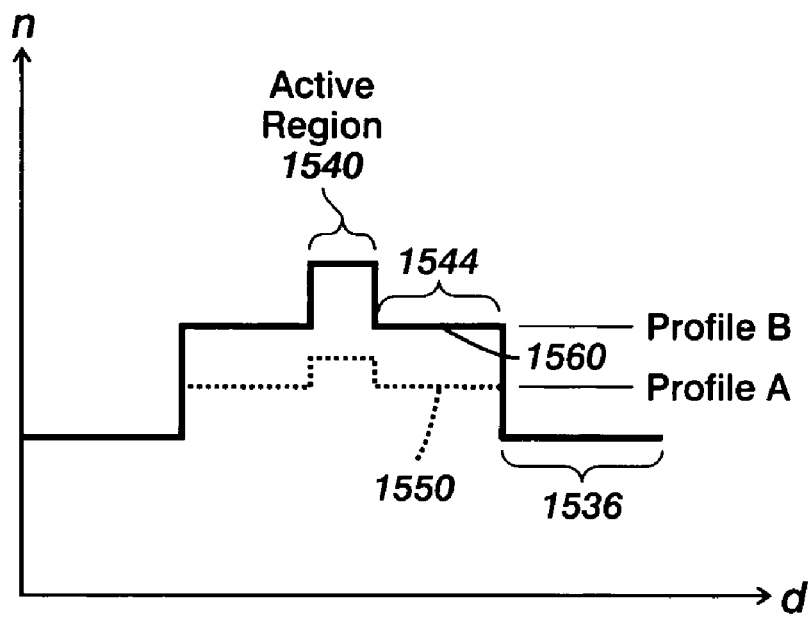
FIG. 15B shows the index profile at two sample locations in the structure of FIG. 15A.

One method of modifying optical vertical confinement is to adjust the refractive index differential between the core layers 1540 1544 and the waveguide layers 1532, 1536 in the vertical direction (perpendicular to the waveguide core axis and in the plane of the drawing). Such adjusting can be done by hydrogenation of the waveguide core. FIG. 15A shows gradually increasing the hydrogen concentration along the waveguide core in the direction indicated by arrow 1512, the refractive index along the axis of the waveguide core (along a direction parallel to arrow 1512) also gradually increases. Because the cladding layers of the waveguide, layers 1532, 1536 do not contain nitrogen, the bandgap of the cladding layer remains approximately constant along the axis of the waveguide. Thus, in the example shown, the gradual increase in hydrogenation along the waveguide core results in a decrease in the index differential between core layers 1540, 1544 and waveguide layers 1532, 1536. A decreasing index differential results in mode spreading as the wave propagates away from laser 1508. This mode spreading improves the vertical optical far field distribution which in turn improves the transverse far field pattern. FIG. 15B shows the refractive index plotted at two points, Point A and Point B of in the structure of FIG. 15A. The plot shows the index of refraction profile gradually decreasing with increasing distance from the semiconductor laser.

Thus, by controlling the hydrogen concentration along the waveguide core as shown in FIG. 15, the optical modal profile in the vertical direction can be improved. Likewise, by controlling the hydrogen concentration on either side of the waveguide core as shown in FIG. 14, the optical modal profile in the lateral direction can be controlled. The improvement of the modal profile in both the lateral direction and the vertical direction can be used to improve the transverse far field pattern.

Figure 16:
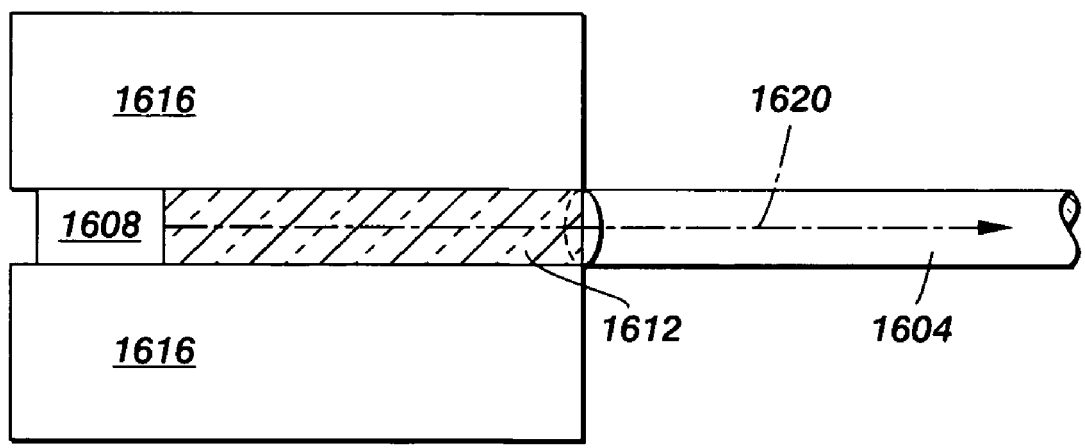
FIG. 16 shows a three dimensional view of a various regions of a semiconductor waveguide coupling a glass fiber to a semiconductor laser.

The improvement of the transverse far field pattern is particularly helpful in applications where light from a laser 1608 is being coupled into a glass fiber 1604 a top view of which is shown in FIG. 16. Different optical modes in the laser and the fiber complicates optical coupling. In particular, the angle at which an optical fiber can receive light, the acceptance angle, is often small, typically less than 20 degrees. By creating an appropriate far field pattern, in particular by using a section of the previously described semiconductor waveguide 1612, the input of the fiber can be better matched to the output of the semiconductor waveguide.

The top view of the laser and fiber structure of FIG. 16 shows section 1616 a heavily hydrogenated region to create the lateral confinement for an optical signal in a waveguide 1612 (in one example, a cross section of waveguide 1612 is the cross section of waveguide 1400 shown in FIG. 14). The gradual reduction of hydrogenation along the waveguide axis is shown by arrow 1620 which might be considered analogous to arrow 1512 of FIG. 15.

Traditional fiber optic matching techniques include designing traditional taper structures and fabrication the tapers. (e.g., as described in Y Shani et al. Applied Physics Letters 55, 2389 (1989) or Kasaya K, Mitomi O, NaganumaM, Kondo Y and Noguchi Y 1993 A simple laterally tapered waveguide for low-loss coupling to single-mode fibres IEEE Photon. Technol. Lett. 3 345 and references therein) Taper fabrication uses complicated etching and regrowth operations. By gradually adjusting the hydrogen concentration in the waveguide section 1612 between the laser 1608 and a fiber, such as glass fiber 1604, many different taper equivalent structures may be formed by a simple planar processing step. In particular, hydrogen induced bandgap changes can be used to taper the semiconductor waveguide and thereby transform the optical mode profile between different components on an opto-electronic integrated circuit (OEIC) or to enable efficient coupling from the OEIC into glass fibers.

Figure 17:
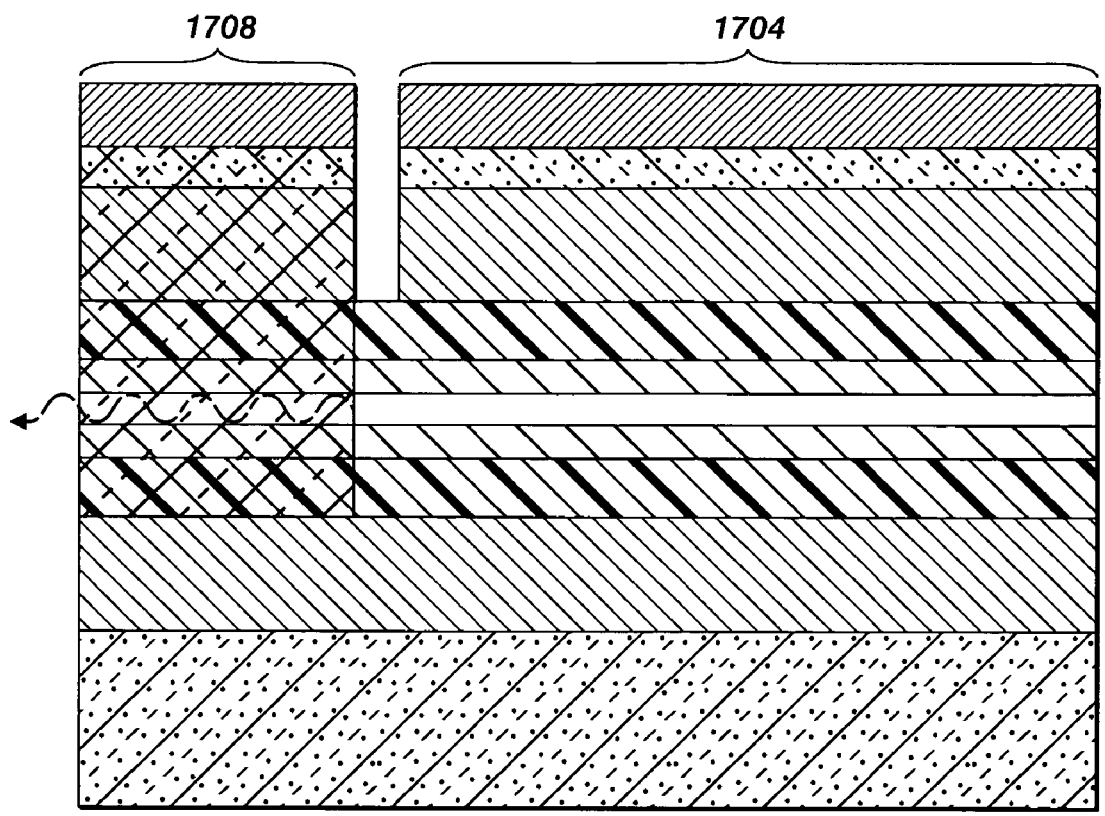
FIG. 17 is a cross section view of a two section laser diode structure with a modulator and amplifier region.

The waveguides of FIGS. 14-15 may be used to interconnect and integrate multiple active and passive devices on a single semiconductor wafer. For example, semiconductor lasers with monolithically integrated modulators are commercially available for InGaAsP systems. FIG. 17 shows a laser 1704 and modulator 1708 section coupled by a hydrogen induced bandgap shifted passive waveguide section. Note that modulator and laser can be fabricated from the same epi-structure. Modulator and amplifier sections can share the same InGaAsN active region; however the amplifier and modulator sections require active regions with slightly different band gap energies in order to reduce the absorption loss in the modulator section. By employing the hydrogen induced bandgap shift in InGaAsN material this can be easily done. Two-section laser diodes, where modulator and amplifier section share the same longitudinal cavity and conventional laser modulator combinations are demonstrated in other materials, (e.g., M. Suzuki, Y. Noda, H. Tanaka, S. Akiba, Y. Kushiro, and H. Isshiki, J. Lightwave Technol. 5, 1277~1987!. Or T. Tanbun-Ek, Y. K. Chen, J. A. Grenko, E. K. Byrne, J. E. Johnson, R. A. Logan, A. Tate, A. M. Sergent, K. W. Wecht, P. F. Sciortine, and S. N. G. Chu, J. Cryst. Growth 145, 902~1994 or R. M. Lammert, G. M. Smith, S. Hughes, M. L. Osowski, A. M. Jones, and J. J. Coleman, IEEE Photonics Technol. Lett. 8, 797~1996). In traditional systems, the bandgap shift between modulator and amplifier section is normally achieved by selective area growth or with a separate regrowth step, which makes the fabrication of devices in these other materials systems quite elaborate and complicated. The preceding example of a laser modulator combination has been provided as one example to demonstrate how interconnect and integrate different active elements (laser with different emission wavelength, optical, light intensity modulator, phase modulators and photo detectors) can be integrated and interconnected with various passive elements such as passive waveguides, beam splitter, (wavelength selective) coupler and taper structure. The example should not be interpreted to limit the types and methods by which these devices may be interconnected.

Using the techniques shown in FIGS. 14 and 15, the control of vertical and lateral index profiles in semiconductor material using hydrogenation can be used to fabricate other passive devices such as beamsplitters. FIGS. 18-22 show exemplary embodiments of various circuits that may be fabricated using the techniques previously described, particularly the techniques described in FIGS. 14-15. Thus all the structures of FIGS. 18-22 may be fabricated on a single wafer with the interconnects between the lasers, diodes, amplifiers and detectors being fabricated on the same wafer as the devices. This integration greatly facilitates device fabrication.

In FIG. 18, two methods are shown of coupling a laser diode to a monitor diode. In a first configuration 1804, a beam splitter 1812 splits the signal from laser diode 1808. Some of the light is guided to a monitor diode 1816 while the remaining light travels along a hydrogenated semiconductor waveguide 1818 to a taper 1820 where it couples to other devices or waveguides such as a glass fiber optic cable. In a second configuration, a hydrogenated semiconductor waveguide 1830 carries signals from a laser diode 1828 to a monitor device 1824. Note that monitor diode, laser and passive waveguide and splitter may be fabricated from the same epilayer.

FIG. 19 shows coupling a laser diode 1904 to various amplifiers 1908 using waveguides and beamsplitters formed by hydrogenating lateral regions on a semiconductor wafer. In the example of FIG. 19, an amplifier is a structure that provides optical gain and in one example has a structure similar to a laser structure except that no optical feedback is provided. In general, an amplifier is any structure that receives an optical input and provides gain to that input.

Figure 20:
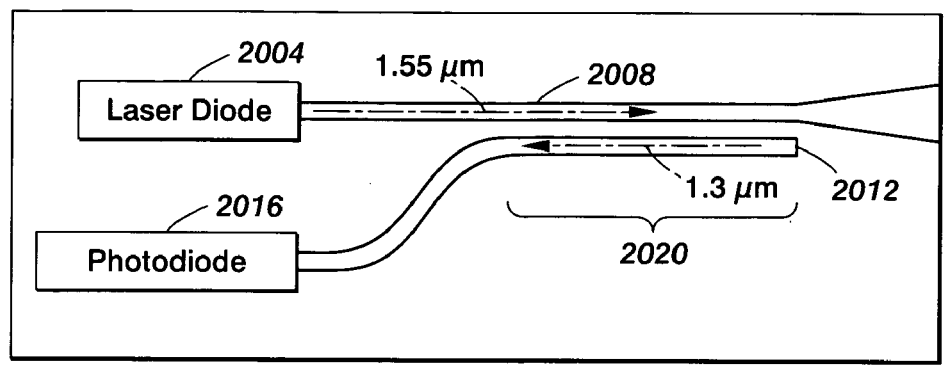

The structure of FIG. 20 can also be completely formed on a single wafer. FIG. 20 shows an integrated receiver/transmitter module comprising a laser diode, a photodiode, waveguide sections and a wavelength selective waveguide coupler. The laser diode 2004 outputs light at a first frequency (in this example, 1.55 micrometers) along a semiconductor waveguide 2008 to a taper for output to external devices such as a glass fiber cable. The coupler directs an incoming light signal (e.g. 1.3 μm) from the glass fiber to photodiode 2016. In the illustrated embodiment, the coupler consists of two waveguide sections 2008 and 20012 fabricated very close to each other so that the optical modes are coupled via evanescent waves. Coupling length 2020 is chosen such that light with a wavelength of 1.3 μm is coupled almost completely whereas 1.55 μm light passes the coupler almost unaffected.

Figure 21:
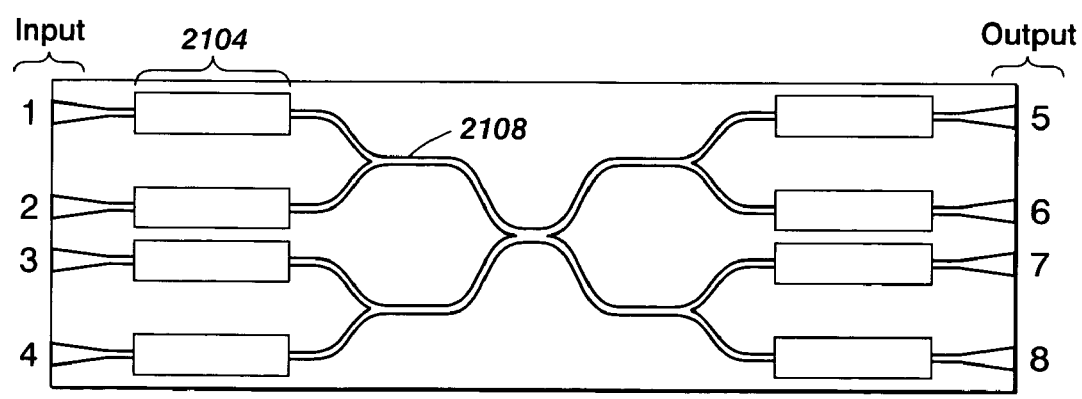

FIG. 21 shows an exemplary embodiment of a complicated circuit, an OEIC (opto-electronic integrated circuit) for optical routing including various beam splitters, light modulators and amplifier sections that may be fabricated on a single wafer. The circuit includes arrays of amplifier/attenuators 2104, coupled by various semiconductor waveguides. The purpose of this device is to direct light from a selected entrance to one defined output. For example, in order to connect input 2 with output 8, amplifier/attenuator sections close to input 2 and 8 are switched to light amplification while maintaining all other amplifier/attenuator sections in a light attenuation state. Thus the only transparent pass is between gate 2 and 8. By using such a structure, beam splitter internal losses and waveguide attenuation can be (over)compensated in the amplifier sections. The illustrated configuration is particularly suitable for directing one particular input gate to one or more output gates in a multiplexer type of structure.

Although the preceding description includes numerous details including hydrogen concentrations, optical circuit configurations, different methods to change hydrogen concentration, and different laser designs. For example, devices such as lasers are described although other components such as light emitting diodes and amplifiers may also use the techniques described herein. Fine details such as the active layer composition as AlGaAsN or InGaAsN are used as examples to facilitate understanding of the device, and to provide example structures. However, these details are not intended nor should they be used to limit the invention as alternate embodiments are understood to be possible without changing the intended invention. Thus the invention should only be limited by the claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others.

What is claimed is:

1. A method of tuning the wavelength of light output by a semiconductor light emitting structure after initial operation of that light emitting structure, comprising:

forming a first light emitting device including a semiconductor active region that includes gallium, arsenide and nitride, the semiconductor active region designed to emit light;

forming a first electrical contact on a first side of the active region and a second electrical contact on a second side of the active region, the electrical contacts to guide electrical current flow through the active region;

passing a first current between said first and second electrical contacts and thus through the active region to thereby cause the light emitting structure to emit light at a first wavelength;

determining the first wavelength of the light emitted by the light emitting structure;

determining a desired second wavelength output of the semiconductor structure; and, changing the amount of hydrogen in the active region designed to emit light to partially change the effects of the nitride in the semiconductor active region such that when said first current flows from the first electrical contact and is directed through the active region to the second electrical contact, the wavelength of light emitted by the semiconductor light emitting structure is changed from said first wavelength to approximately said second wavelength.

2. The method of claim 1 wherein the semiconductor structure is a laser.

3. The method of claim 2, wherein the semiconductor structure is a vertical cavity surface emitting laser.

4. The method of claim 3 wherein the changing of the amount of hydrogen is done by placing the vertical cavity surface emitting laser in a vacuum chamber at a temperature between 200 and 450 degrees centigrade and exposing the laser to hydrogen.

5. The method of claim 3 wherein the wavelength is changed by less than 20 nm.

6. The method of claim 3 wherein the wavelength output is kept between 1.3 micrometers and 1.55 micrometers.

7. The method of claim 1 wherein the first active region includes AlGaAsN.

8. The method of claim 1 wherein the first active region includes InGaAsN.

9. A semiconductor structure to output light comprising:

a cavity including an active region designed to emit light, the active region includes at least gallium, arsenide and nitride, the active region including a sufficient level of hydrogen such that the hydrogen partially negates the nitride in the active region thereby increasing the bandgap of the active region;

a first electrical contact coupled to a first side of the cavity and a second electrical contact coupled to a second side of the cavity, the first electrical contact and the second electrical contact to provide electrical current to the active region and cause the output of light from the active region; and the active region of a type in which the concentration of hydrogen therein has been changed after an electric current is passed between said first and second electrical contacts and light of a first wavelength is output from said active region thereby, said hydrogen concentration changed from a first concentration to a second concentration, said change in hydrogen concentration causing a change in the wavelength of light output by the active region from said first wavelength to a second wavelength.

10. The semiconductor structure of claim 9 further comprising a stack of distributed Bragg reflecting mirrors bounding at least one side of the cavity.

11. The semiconductor structure of claim 9 further comprising: a cladding layer between the electrical contact and the active region, the cladding to guide the wave propagating in the active region.

12. The semiconductor laser structure of claim 11 further comprising:

a GaAsN spacer between the active region and the cladding layer.

13. The semiconductor structure of claim 9 wherein the active region includes InGaAsN.

14. The semiconductor structure of claim 9 wherein the active region includes AlGaAsN.

15. A semiconductor wafer comprising:

a layer including at least GaAsN;

a first region of the layer forming an active region of a first light emitting device, the first active region designed to emit light and having a first hydrogen concentration to react with the nitride in the first region of the layer to result in a bandgap in the first region;

a second region of the layer forming an active region of a second light emitting device, the second active region designed to emit light and having a second hydrogen concentration, the second hydrogen concentration different from the first hydrogen concentration, the second hydrogen concentration to react with the nitride in the second region of the layer to result in a bandgap in the second region that is different than the bandgap in the first second region;

electrical contacts coupled to the first active region and the second active region such that when current flows through the first active region and the second active region, a frequency of light output from the first active region differs from a frequency of light output from the second active region; and at least one of said first and second regions of a type in which the concentration of hydrogen therein has been changed after an electric current is passed between said electrical contacts coupled to said at least one of said first and second regions and light of a first wavelength is output thereby, said hydrogen concentration changed from a first concentration to a second concentration, said change in hydrogen concentration causing a change in the wavelength of light output by said at least one of said first and second regions from said first wavelength to a second wavelength.

16. The semiconductor wafer of claim 15 wherein, following a change in hydrogen concentration of said at least one of said first and second regions, the wavelength of light output by the first active region is between 1000 and 1700 nm and the wavelength of light output by the second active region is within 200 nm of the wavelength output by the first active region.

17. The semiconductor wafer of claim 15 wherein, following a change in hydrogen concentration of said at least one of said first and second regions, the concentration of hydrogen in the first active region and the second active region is between $1\times10^{13}$ cm$^{-3}$ and $1\times10^{20}$ cm$^{-3}$.

18. The semiconductor wafer of claim 15 wherein the first active region and the second active region are suitable for use as a first laser in a wavelength division multiplexing optical communication system.

19. The semiconductor wafer of claim 15 wherein the layer is epitaxially grown and is approximately uniform across the wafer.

20. The semiconductor wafer of claim 15 wherein the first hydrogen concentration and the second hydrogen concentration are obtained by masking the wafer and exposing the wafer to a hydrogen gas.

21. The method of claim 1, wherein said step of changing the amount of hydrogen in the active region comprises the step of heating the light emitting structure to a selected temperature for a selected period of time to drive hydrogen out of the active region.

* * * * *